United States Patent
Mier-Hicks et al.

(10) Patent No.: US 11,631,348 B2
(45) Date of Patent: Apr. 18, 2023

(54) SYSTEM AND METHOD FOR INSTALLING A TRANSPARENT ORGANIC LIGHTING DIODE (TOLED) DISPLAY WITH TRANSPARENCY CONTROL MEDIUM AND WITH A VERSATILE MOUNTING SYSTEM

(71) Applicant: Bi-Search International, Inc., Irvine, CA (US)

(72) Inventors: Rodrigo Mier-Hicks, Irvine, CA (US); Kevin Kim, Irvine, CA (US); Ivan Barba, Irvine, CA (US)

(73) Assignee: BI-SEARCH INTERNATIONAL, INC., Irvine, CA (US)

( * ) Notice: Subject to any disclaimer, the term of this patent is extended or adjusted under 35 U.S.C. 154(b) by 0 days.

(21) Appl. No.: 17/486,531

(22) Filed: Sep. 27, 2021

(65) Prior Publication Data
US 2022/0327971 A1    Oct. 13, 2022

Related U.S. Application Data

(60) Provisional application No. 63/173,768, filed on Apr. 12, 2021.

(51) Int. Cl.
| | |
|---|---|
| *G09F 9/33* | (2006.01) |
| *H01L 27/32* | (2006.01) |
| *H01L 51/52* | (2006.01) |
| *H05K 7/16* | (2006.01) |

(52) U.S. Cl.
CPC ............ *G09F 9/335* (2021.05); *H01L 27/323* (2013.01); *H01L 27/3232* (2013.01); *H01L 51/5262* (2013.01); *H05K 7/16* (2013.01); *H01L 2251/5323* (2013.01)

(58) Field of Classification Search
CPC ...... G09F 9/335; G09F 9/3026; G09F 19/227; G09F 27/005; H01L 27/323; H01L 27/3232; H01L 51/5262; H01L 2251/5323; H05K 7/16
See application file for complete search history.

(56) References Cited

FOREIGN PATENT DOCUMENTS

KR         20140097922 A   *  8/2014  ............... G09F 9/35

* cited by examiner

*Primary Examiner* — Donald L Raleigh
(74) *Attorney, Agent, or Firm* — Blue Capital Law Firm, P.C.

(57) ABSTRACT

A system and method for removable or semi-permanent installation of a transparent organic lighting diode (TOLED) display with transparency control are disclosed. In one embodiment, the system includes a TOLED display that includes a TOLED panel with a front side and a back side, a cover glass or a touch sensor coupled to the front side of the TOLED panel, and a transparency control medium coupled to the back side of the TOLED panel to provide transparency control of the TOLED panel, wherein the transparency control medium is an electrochromic (EC) glass, a Suspended Particle Device (SPD) film, or a Polymer Dispersed Liquid Crystal (PDLC) film. The system further includes a versatile hinge assembly coupled to the TOLED display to enable the TOLED display to be used in a table top or desktop configuration or to be mounted to a support structure.

14 Claims, 52 Drawing Sheets

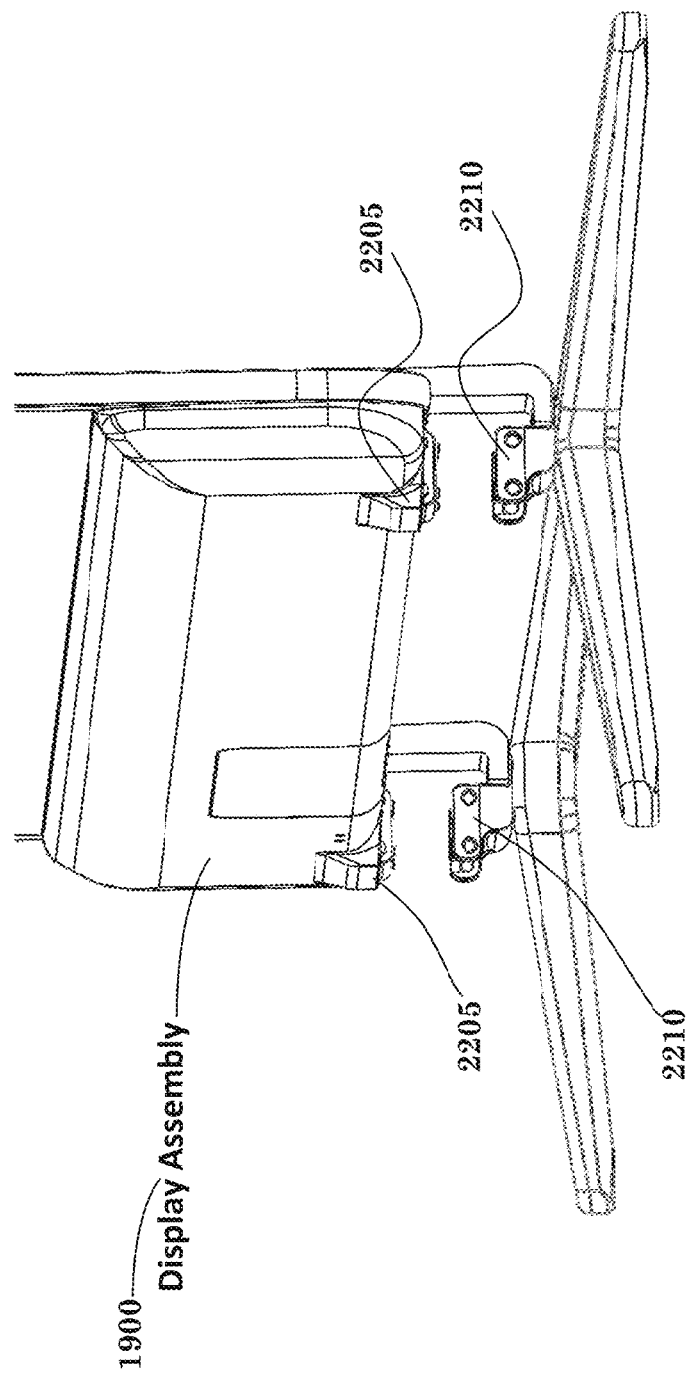

US 11,631,348 B2

SYSTEM AND METHOD FOR INSTALLING A TRANSPARENT ORGANIC LIGHTING DIODE (TOLED) DISPLAY WITH TRANSPARENCY CONTROL MEDIUM AND WITH A VERSATILE MOUNTING SYSTEM

CROSS-REFERENCE TO RELATED APPLICATIONS

The present application claims the benefit of U.S. Provisional Patent Application Ser. No. 63/173,768 filed on Apr. 12, 2021, the entire disclosure of which is incorporated herein in its entirety by reference.

FIELD

This disclosure generally relates to TOLEDs, and more particularly, to a system and method for installing a TOLED display with transparency control medium and with a versatile mounting system.

BACKGROUND

TOLED is a display technology that uses transparent electrodes and light emitting materials. TOLED embeds OLED technology in thin, transparent glass or plastic substrates that are capable of emitting light from the top or bottom, or both. Because TOLED displays that emit from both top and bottom are 70% transparent when not in use, they could be incorporated into many useful applications.

As an example, the TOLED displays can be used in shopping windows (or other architectural glasses, flat or curved). The shopping windows show the product on the inside as well as show text or advertisements on the glass. For example, there could be a pair of shoes behind the window and at the same time the window has information scrolling across it like prices, special deals, or advertisement video clips. This type of showcase is becoming more popular as see-through screens are becoming cheaper and more available.

Currently, several bonding methods exist to install displays onto architectural glass. However, they all share the trait that the installation is permanent. Trying to remove a display from architectural glass when installed with current available bonding methods is a very risky process, which most of the time leads to damage to the display, the glass, or both. Due to the shorter use life that TOLEDs possess (~3 years) in comparison with architectural glass (~12+ years), it is imminent that TOLED maintenance or replacement will be a necessity for the user. Therefore, it would be beneficial to have a system and method to semi-permanently install TOLED displays on architectural glass (such as windows) in a reworkable/removable, efficient, and aesthetically pleasing manner.

Furthermore, it would be advantageous to have a system and method to install the TOLED assembly on a support structure rather directly on the architectural glass so that the TOLED assembly could be installed on or attached to any surface that is structurally sound to support the proposed TOLED assembly. More specifically, it would be advantages to have hinges to facilitate the rotation of the TOLED display to different positions and to provide relatively easy removal of the TOLED display when mounted to a structural frame (e.g., a window frame). In addition, it would be advantageous to have a versatile mounting system that allows for the attachment of leg stands to enable the use of the TOLED assembly in a table top configuration. Also, it would be advantageous to have a system and method to construct the TOLED assembly with transparency control medium to facilitate transparency control.

SUMMARY

A system and method for removable or semi-permanent installation of a transparent organic lighting diode (TOLED) display with transparency control are disclosed. In one embodiment, the system includes a TOLED display that includes a TOLED panel with a front side and a back side, a cover glass or a touch sensor coupled to the front side of the TOLED panel, and a transparency control medium coupled to the back side of the TOLED panel to provide transparency control of the TOLED panel, wherein the transparency control medium is an electrochromic (EC) glass, a Suspended Particle Device (SPD) film, or a Polymer Dispersed Liquid Crystal (PDLC) film. The system further includes a versatile hinge assembly coupled to the TOLED display to enable the TOLED display to be used in a table top or desktop configuration or to be mounted to a support structure.

BRIEF DESCRIPTION OF THE DRAWINGS

FIG. 26 shows a display assembly using the hinge mechanism assembly (shown in FIGS. 22A-22D) in a desktop configuration according to one exemplary embodiment.

DETAILED DESCRIPTION

Figure 1:
FIG. 1 shows an exemplary installation of a video wall consisting of multiple TOLED displays in portrait mode on an architectural glass or window according to one exemplary embodiment.
Figure 2:
FIG. 2 illustrates an exemplary installation of a TOLED display in landscape mode on an architectural glass or window according to one exemplary embodiment.

FIG. 1 shows an exemplary installation 100 of a video wall consisting of multiple TOLED displays 105a and 105b in portrait mode on an architectural glass or window according to one exemplary embodiment. FIG. 2 illustrates an exemplary installation 200 of multiple TOLED displays 205a and 205b in landscape mode on an architectural glass or window according to one exemplary embodiment.

Figure 3:
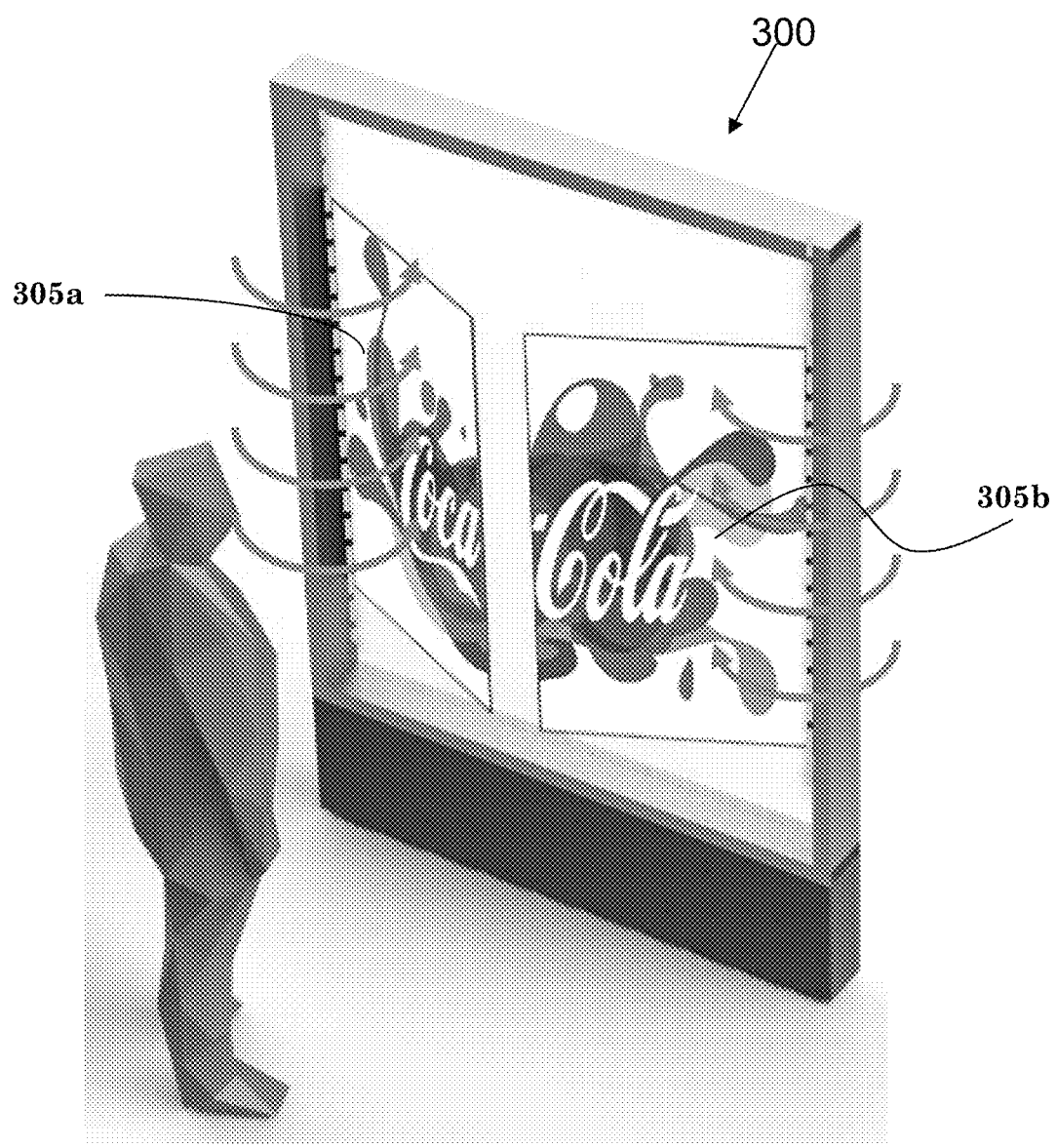
FIG. 3 shows an exemplary frame-less installation system with multiple TOLED displays and in portrait mode on an architectural glass or window according to one exemplary embodiment.

FIG. 3 shows an exemplary frame-less installation system 300 with multiple TOLED displays 305a and 305b in portrait mode on an architectural glass or window according to one exemplary embodiment. As illustrated in FIG. 3, the frame-less installation system 300 allows for narrow borders between the TOLED displays 305a and 305b that would provide a better overall image. In one embodiment, multiple TOLEDs (in either landscape or portrait) can be combined into a video wall, as long as the glass and the supporting frame are big enough to fit the displays.

Figure 4:
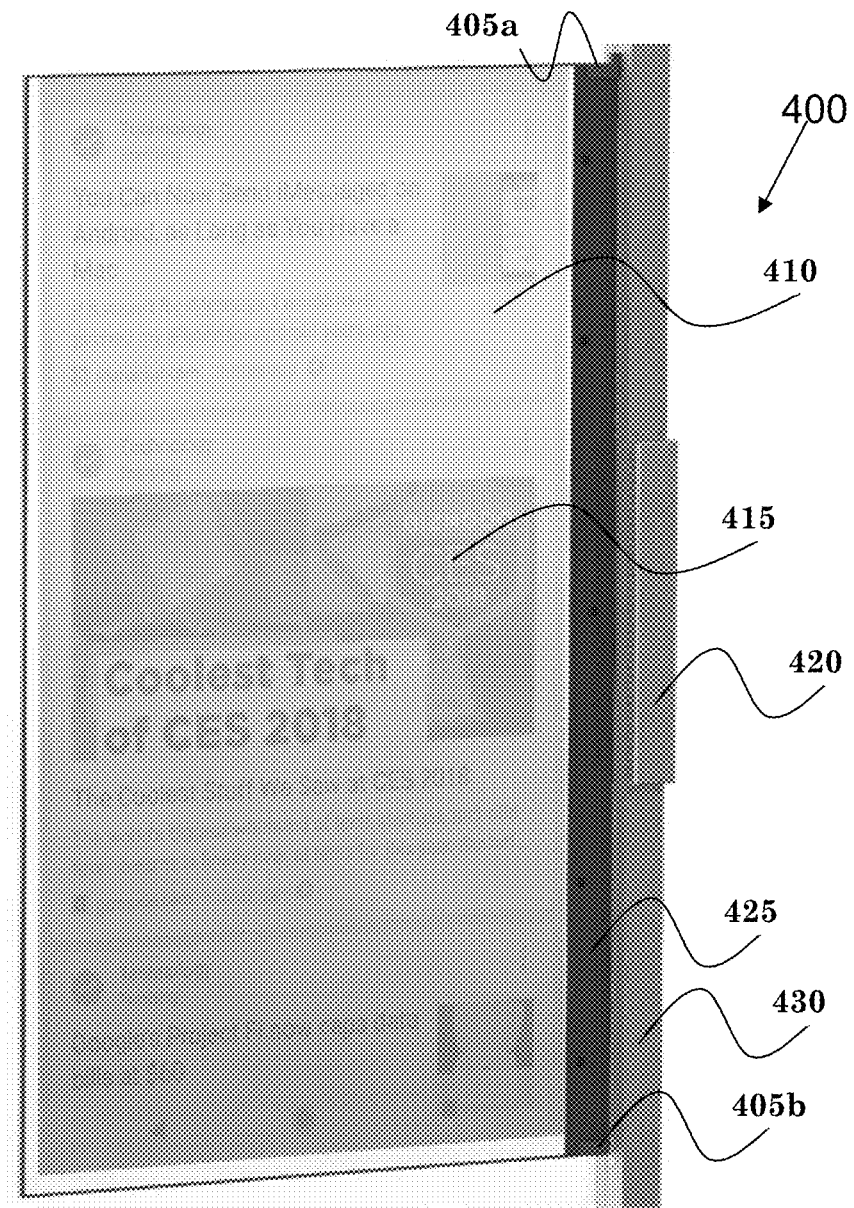
FIG. 4 illustrates an exemplary installation with one TOLED panel according to one exemplary embodiment.

FIG. 4 illustrates an exemplary installation 400 with one TOLED panel 410 according to one exemplary embodiment. In general, hinge assemblies 405a and 405b facilitates installation and removal of the TOLED panel 410 on the architectural glass or window support structure (or mullion). The optical bonding 415 combines the cover glass and the TOLED cell into a single robust part. In one embodiment, the electronics (which used to power and control the TOLED panel) 420 could be housed inside the window's frame or mullion 430. The cover glass 425 with thru holes is bonded to the TOLED panel 410 and then mounted (e.g., screwed) on the window's frame or mullion 430 via hinge assemblies 405a and 405b.

Figure 5:
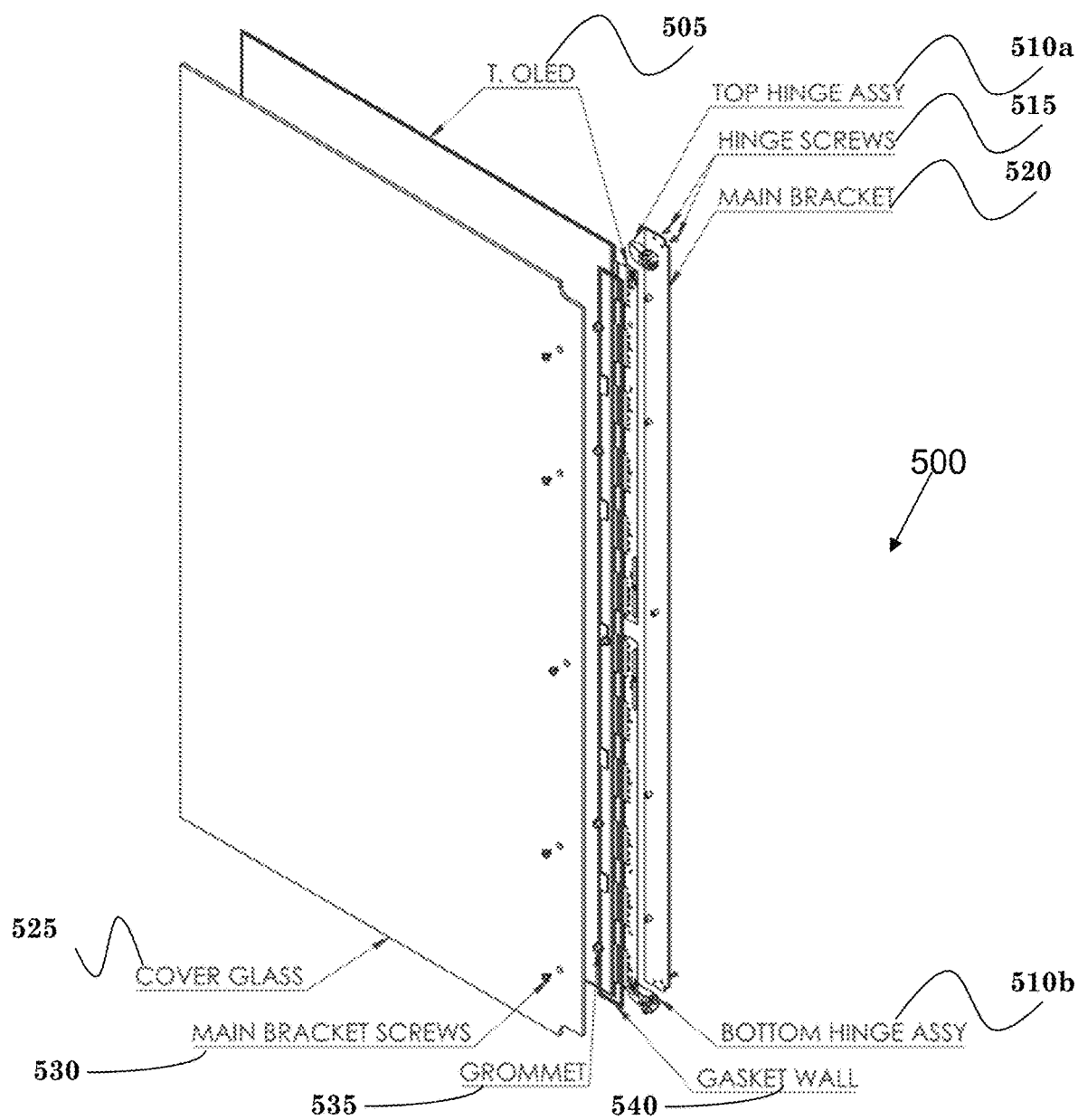
FIG. 5 shows an exploded view of a TOLED display assembly according to one exemplary embodiment.

FIG. 5 shows an exploded view of a TOLED display assembly 500 according to one exemplary embodiment. The TOLED display assembly 500 includes a top hinge assembly 510a and a bottom hinge assembly 510b used to mount the assembly 500 onto an architectural glass or window support structure (or mullion). Hinge screws or fasteners 515 are used to attach the hinge assemblies 510a and 510b to the main bracket 520. Various alternative hinge assemblies are shown in FIGS. 6A-6C and 7A-7C, and FIGS. 13A, 14A-14D, 15, and 16, and are described in further detail below. Main bracket screws or fasteners 530 passes through holes on the cover glass 525 and grommets 535 to bind the cover glass 525 together with the TOLED panel 505 and the gasket wall 540, and to fasten these components to the main bracket 520.

Figure 6A:
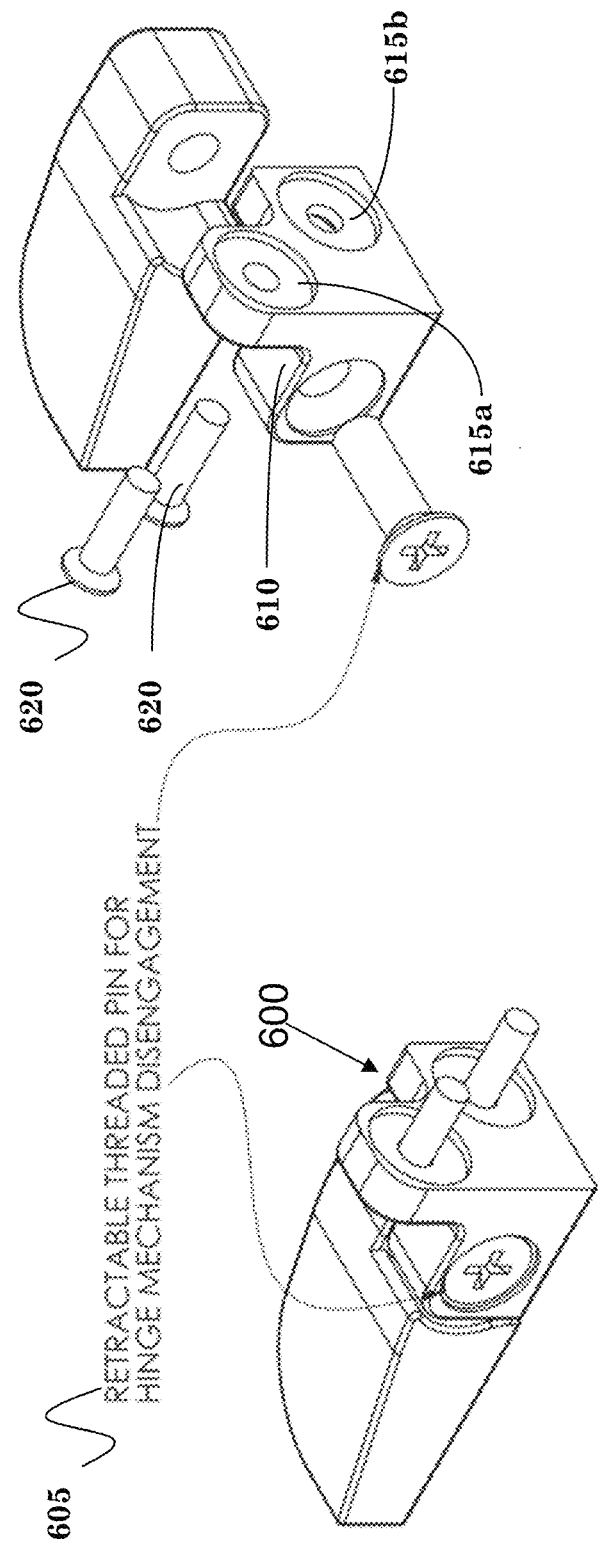
FIGS. 6A-6C show different views of a hinge mechanism assembly according to one exemplary embodiment.

FIG. 6A shows a perspective view and an exploded view of a hinge mechanism assembly 600 according to one exemplary embodiment. As shown in FIG. 6A, the hinge mechanism assembly 600 includes retractable threaded pin 605 for engagement or disengagement of the hinge mechanism 635, a bottom portion (or hinge base) 610 with cavities 615a and 615b to allow a flush mount when using rivet nuts, and mounting screws 620 for mounting the hinge mechanism assembly 600 on a supporting structure (such as a mullion supporting a window).

Figure 6B:
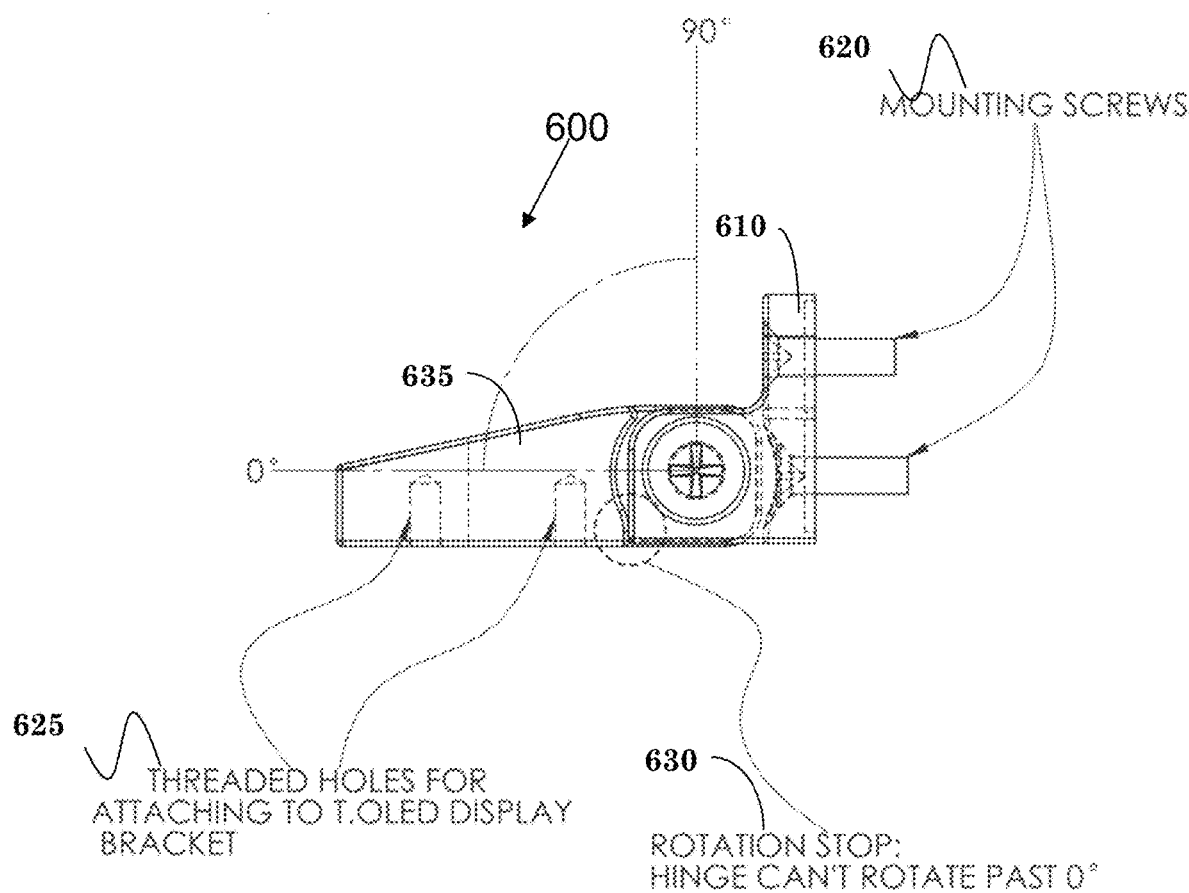

FIG. 6B shows a side view of the hinge mechanism assembly 600 according to one exemplary embodiment. As shown in FIG. 6B, the hinge mechanism assembly 600 includes a top portion (or hinge mechanism) 635 with thread holes 625 for attaching to the TOLED panel or display bracket (shown as element 520 in FIG. 5), and a rotation stop portion 630 to prevent the hinge mechanism (or top portion) 635 from rotating past zero degree.

Figure 6C:
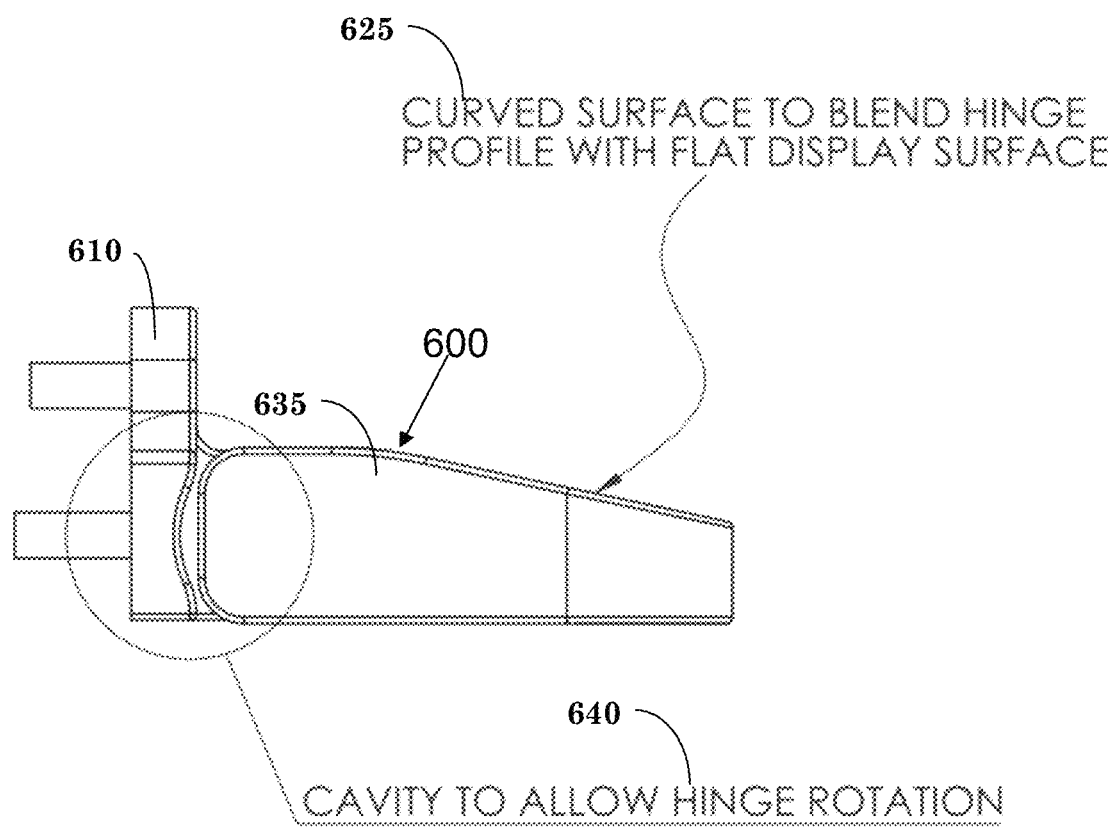

FIG. 6C shows another side view of the hinge mechanism assembly 600 according to one exemplary embodiment. As shown in FIG. 6B, the bottom portion (or hinge base) 610 of the hinge mechanism assembly 600 includes cavity 640 to allow the hinge mechanism 635 to rotate. Furthermore, the top portion (or hinge mechanism) 635 of the hinge mechanism assembly 600 has a curved surface to blend the profile of the hinge mechanism 635 with the flat display surface.

Figure 7A:
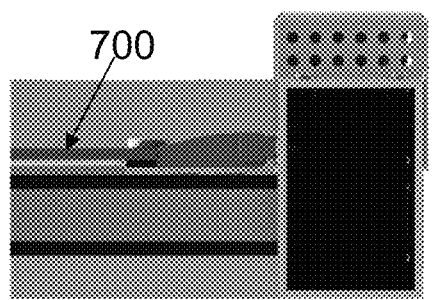
FIGS. 7A-7C illustrate a TOLED display assembly being rotated in various positions in according to one exemplary embodiment.
Figure 7B:
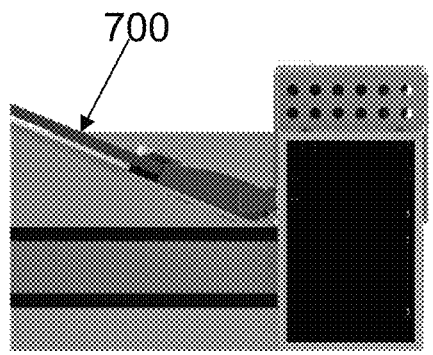
Figure 7C:
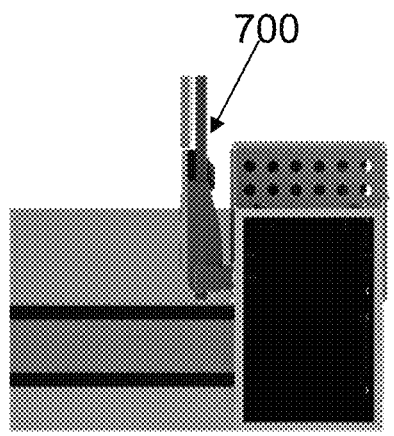

When using the hinge mechanism assembly 600 to mount a TOLED display assembly (shown as element 500 in FIG. 5), the hinge mechanism assembly 600 allows a TOLED display assembly to be rotated to various positions, such as a close (or zero degree) position as shown in FIG. 7A, a partially open position as shown in FIG. 7B, or an open (or ninety degrees) position as shown in FIG. 7C.

Figure 8A:
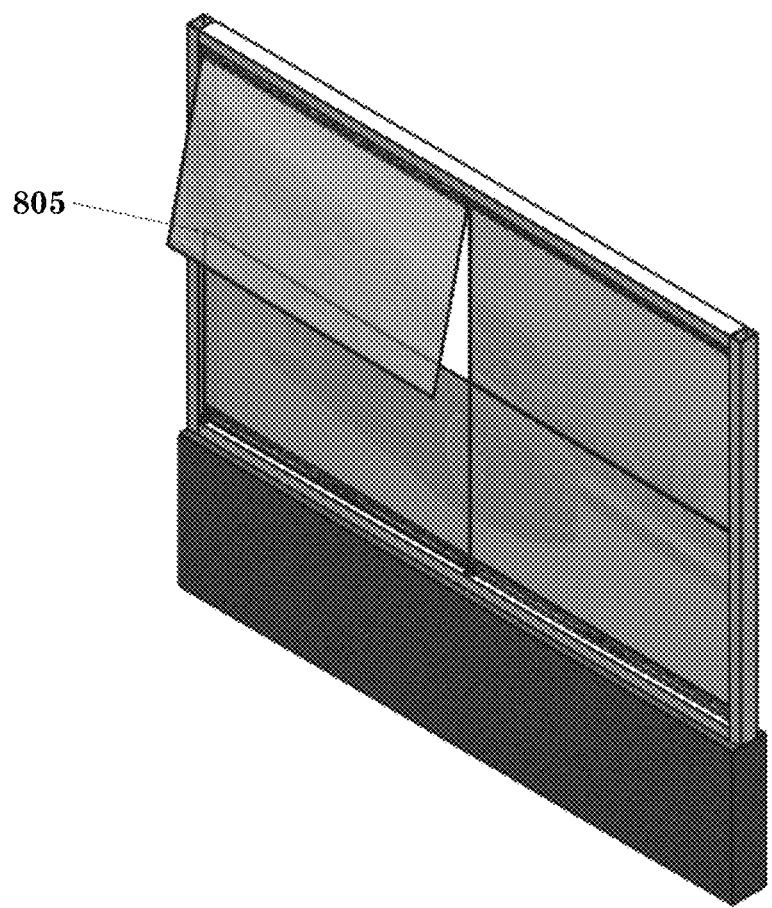
FIGS. 8A and 8B illustrate an installation of a video wall with four (4) TOLED screens on a window according to one exemplary embodiment.
Figure 8B:
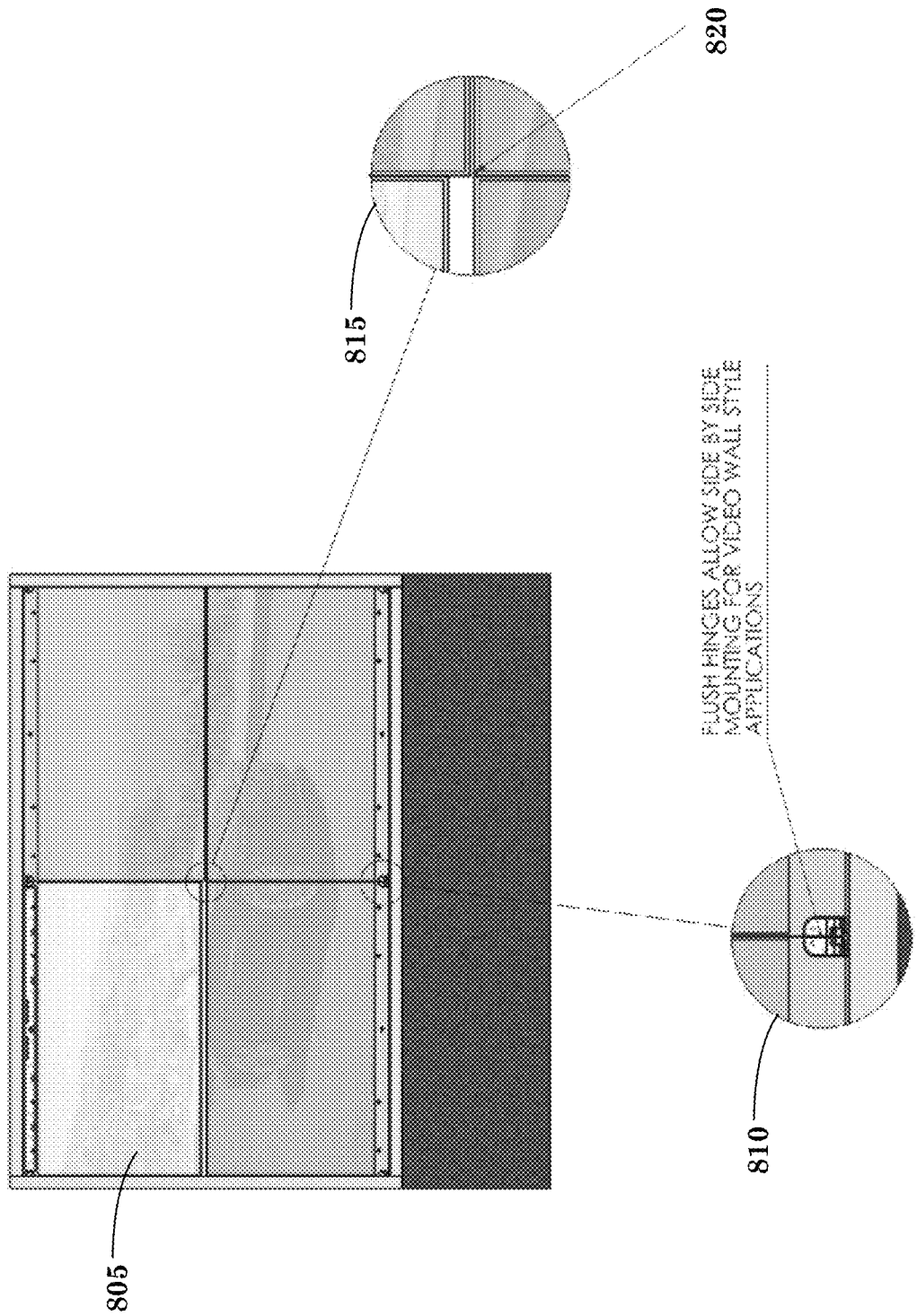

FIGS. 8A and 8B illustrate an installation of a video wall with four (4) TOLED screens on a window using the hinge mechanism assembly 600 (shown in FIGS. 6A-6C) according to one exemplary embodiment. As installed, the TOLED screens 805 could be rotated and raised up (as shown in FIG. 8A) to allow each maintenance of each individual TOLED screen and to also allow access to the window for various purposes (such as cleaning the window). As shown in FIG. 8B, flush hinges 810 allow side by side mounting for video wall style applications. As shown in blown up portion 815, a glass holder piece 820 could be inserted near the intersection corners of the TOLED screen to add rigidity to the video wall.

Figure 9:
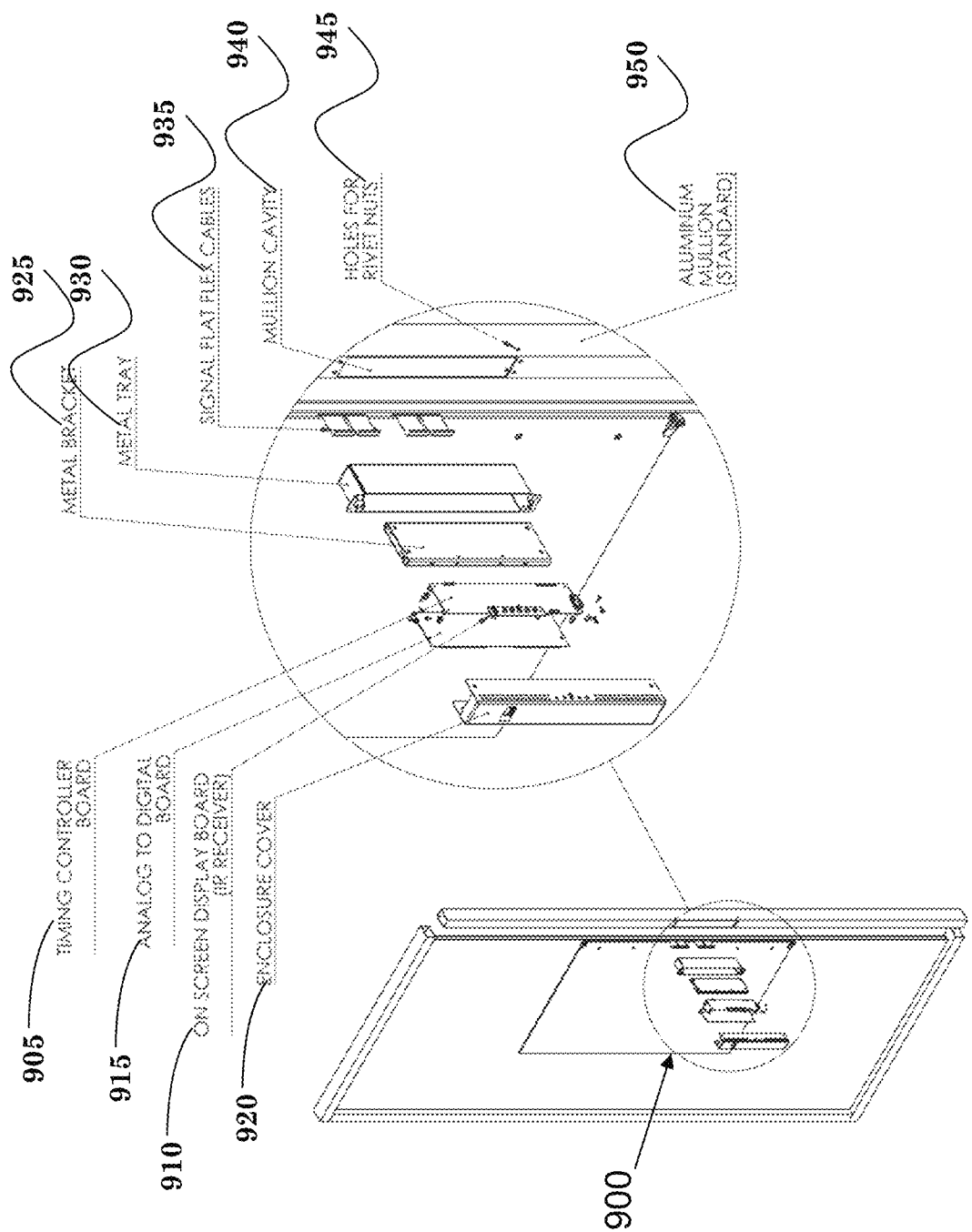
FIG. 9 illustrates an installation where the electronic boards assembly used to control the TOLED screens are installed onto a mullion according to one exemplary embodiment.

FIG. 9 illustrates an installation where the electronic boards assembly 900 used to control the TOLED screens are installed onto the mullion 950 according to one exemplary embodiment. The timer controller board 905, the on-screen display board (IR receiver) 910, and the analog to digital board 915 are mounted on the metal bracket 925, and the mounted electronic board assembly is inserted into the metal tray 930 which is then inserted into the mullion cavity 940. The enclosure cover 920 is mounted on the mullion 950 to cover the mullion cavity 940. In one embodiment, the mullion 950 has holes 945 for rivet nuts or other types of fasteners that are used to fasten the enclosure cover 920 onto the mullion 950. Depending on the dimensions of the mullion, the electronic board assembly may protrude from or sit flush in the mullion. The control box design can be adjusted for both scenarios by changing the enclosure cover 920.

Figure 10:
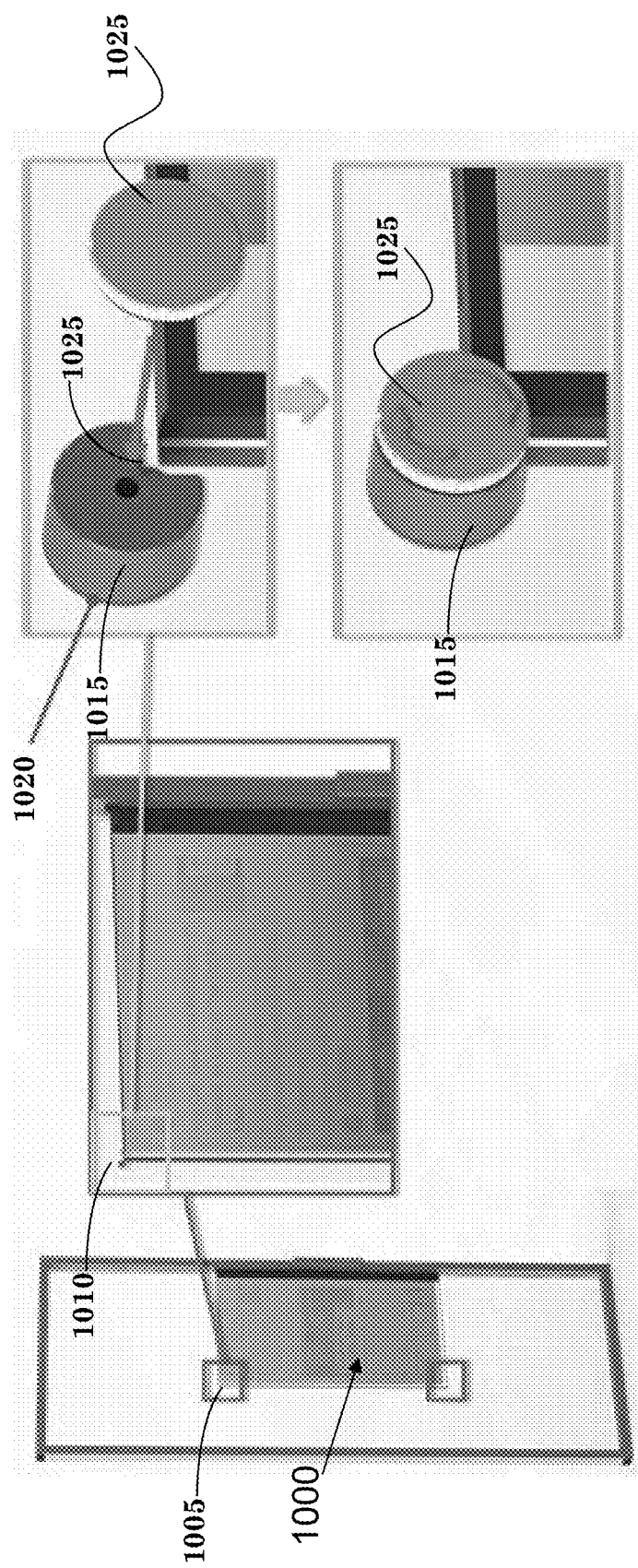
FIG. 10 illustrates an installation of a TOLED screen according to one exemplary embodiment.

FIG. 10 illustrates an installation of a TOLED screen 1000 according to one exemplary embodiment. As shown in blown-up corner portions 1005 and 1010, the installation uses an exemplary hinge stop 1020 to hold the TOLED screen 1000 in place. The hinge stop 1020 has a bottom portion 1015 with a cut-out portion 1025 to receive a corner of the TOLED screen 1000. A top portion 1025 of the hinge stop 1020 is then inserted to hold the TOLED screen 1000 in place.

Figure 11A:
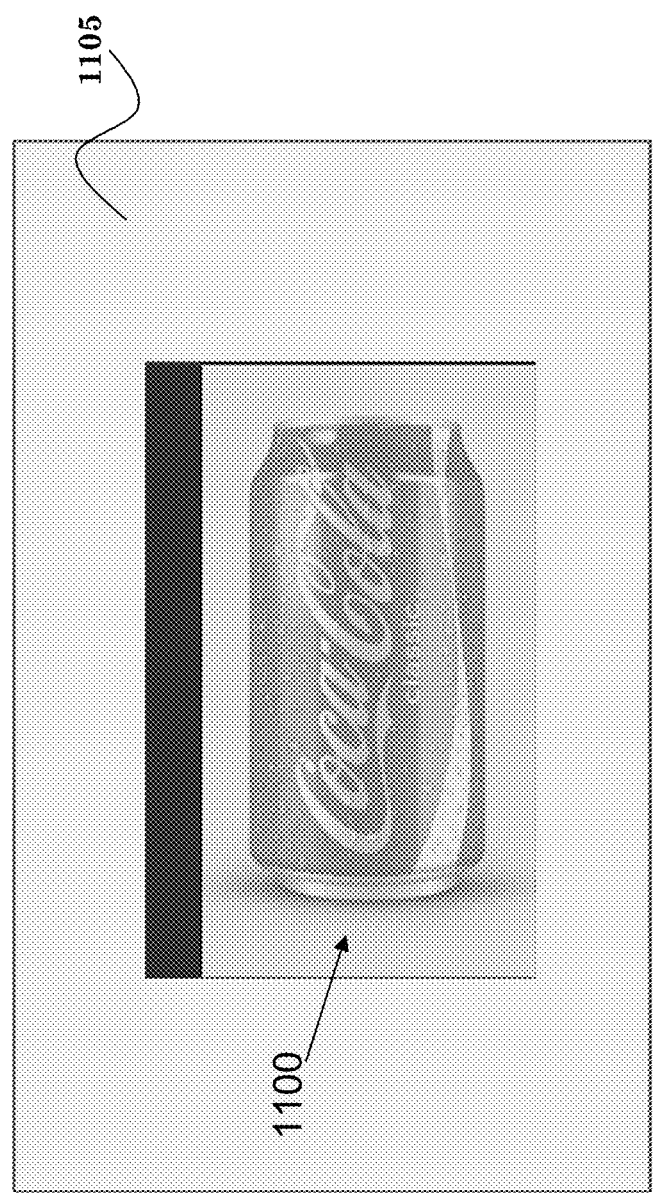
FIGS. 11A-11D illustrate an installation of a TOLED display assembly onto a window using a magnetic hinge according to one exemplary embodiment.
Figure 11B:
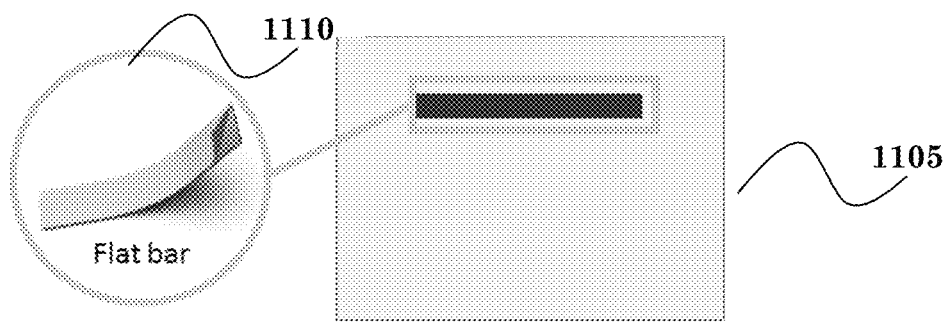
Figure 11C:
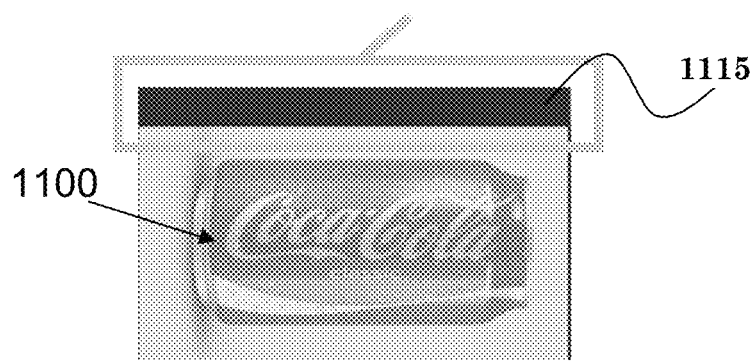
Figure 11D:
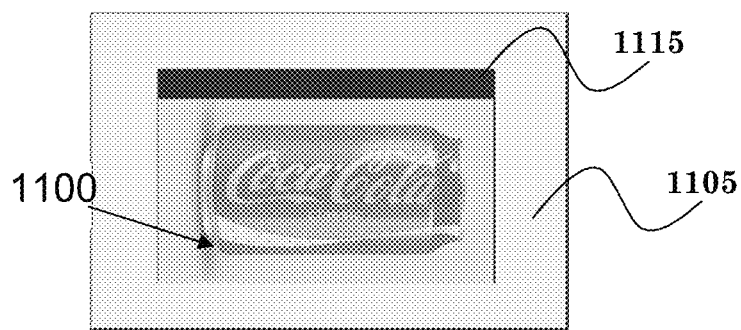

FIGS. 11A-11D illustrate an installation of a TOLED display assembly 1100 onto a window 1105 using a magnetic hinge according to one exemplary embodiment. As shown in FIG. 11B, a metal flat bar 1110 is bonded to the window with optical bond or double sided tape. As shown in FIG. 11C, a magnetic film 1115 is applied to back of the TOLED display assembly 1100. As shown in FIG. 11D, the TOLED display assembly is attached via magnetic force to the metal flat bar 1110 on the window 1105.

Figure 12A:
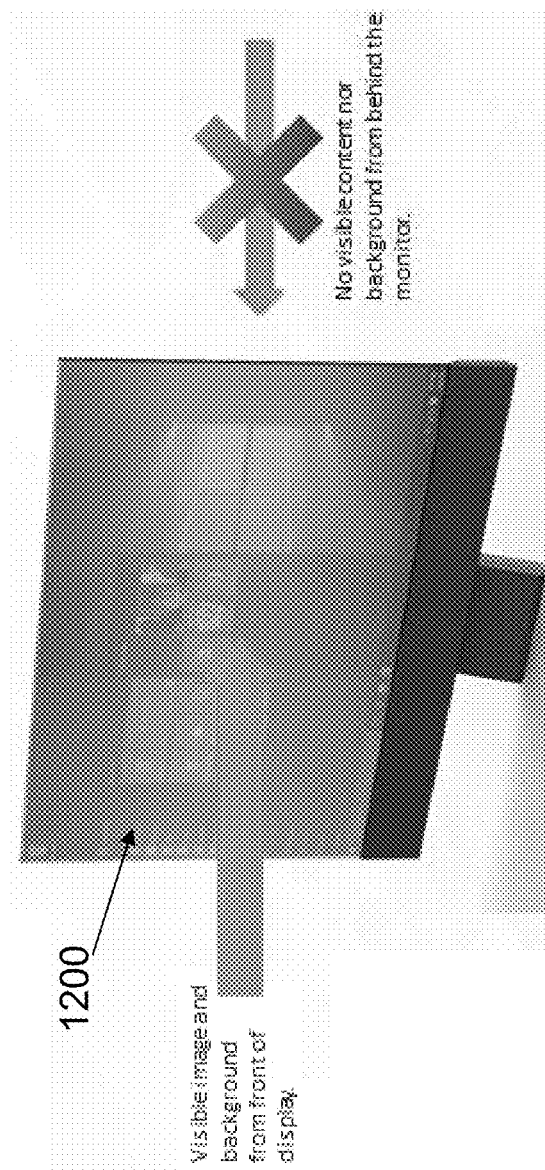
FIGS. 12A-12B illustrate a one-way TOLED display assembly according to one exemplary embodiment.
Figure 12B:
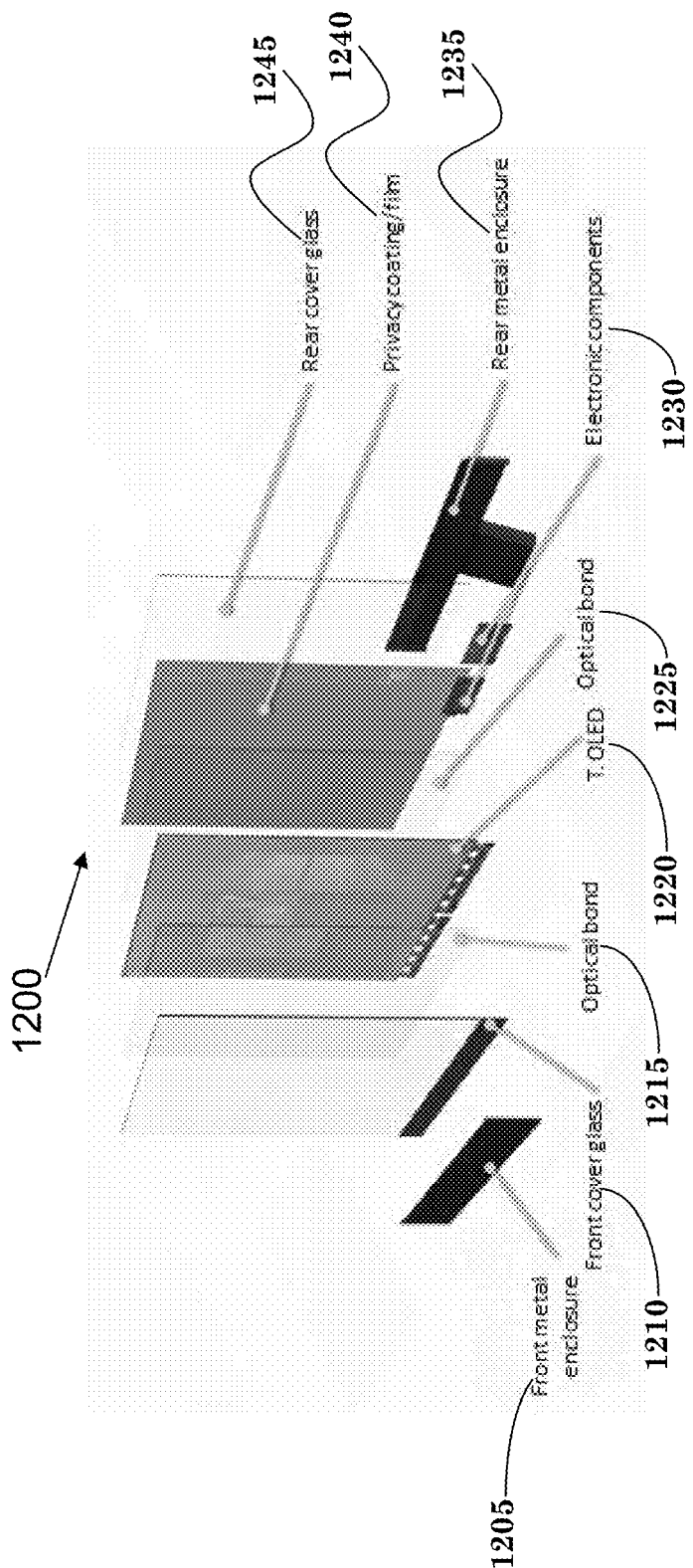

FIGS. 12A-12B illustrate a one-way TOLED display assembly 1200 according to one exemplary embodiment. As shown in FIG. 12A, the one-way TOLED display provides visible image and background from the front of the display, while there is no visible content or background from the back of the display. As shown in FIG. 12B, the front of the one-way TOLED assembly 1200 includes a front optical bond layer 1215 used to bond the TOLED panel 1220 to the front cover glass 1210 which is then attached to the front metal enclosure. The back of the one-way TOLED assembly 1200 includes a back optical bond layer 1225 used to bond a private coating/film to the TOLED panel 1220. A rear metal enclosure 1235 is used to bind the rear cover glass 1245 with the TOLED panel 1220 (along with the bonded private coating/film 1240). The private coating/film 1240 blocks visibility of content or background from the back of the display.

In general, TOLED panels are usually brighter when viewed from the front than from the back. This has to do with the way OLED technology works, where each pixel consists of a discrete LED pointed towards the front. Although traces of an image can still be slightly seen from the back of the TOLED panel, the image is dull and difficult to see from the back of the TOLED. However, the image can still be seen from the back of the TOLED panel when observed carefully. A privacy film or a light mirror-like tint can be applied to the back of the T.OLED panel to remove or block any traces of the image, thus making the TOLED panel transparent only one-way (from the front).

In one embodiment, to achieve the one-way transparency TOLED, a silver reflective mirror film with a light 50% to 70% tint (or lower, depending on the end user application) could be applied to the back of the T.OLED. The mirror like appearance of the film reflects (or deflects) incoming light and makes it difficult to see the TOLED image content from the back of the TOLED.

Figure 13A:
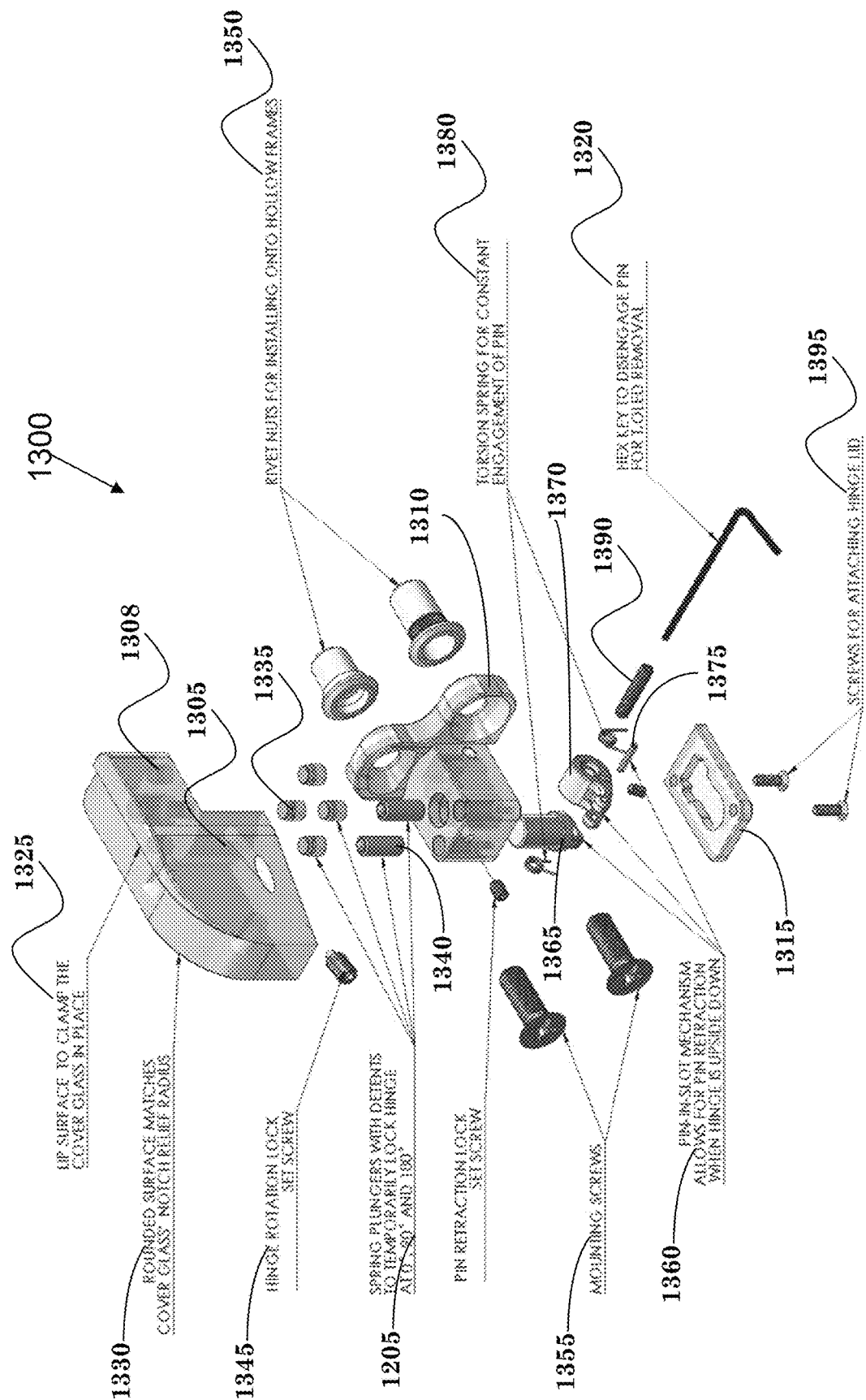
FIG. 13A is an exploded view of an alternative hinge assembly (in a disassembled state) with a hex key for TOLED display removal according to one exemplary embodiment.

FIG. 13A shows an exploded view of an alternative hinge assembly 1300 with a hex key 1320 to disengage a hinge pin for removal of the TOLED display assembly according to one exemplary embodiment. The hinge assembly 1300 includes a hinge 1305, a hinge base 1310, and a hinge base lid 1315. The hinge 1305 is attached to the TOLED panel as shown in FIG. 5. The hinge 1305 has a lip surface 1325 to clamp the cover glass in place, and a rounded surface 1330 that matches the cover glass notch relief radius. The hinge 1305 includes cavities 1308 to receive ball-nose catches or detents 1335. Once embedded in the hinge 1305, the ball nose catches or detents 1335 designed to engage spring plungers 1340 to temporarily lock the hinge 1305 in place and prevent the hinge (and the TOLED panel) from rotating. A rotation lock set screw 1345 can be used to further lock the hinge and prevent the hinge from rotating.

As shown in FIG. 13A, the hinge base 1310 can be mounted onto the window's frame or mullion (shown as element 430 in FIG. 4) using rivet nuts 1350 and mounting screws 1355. A pin-in-slot mechanism 1360 allows a hinge pin 1365 to extend through a hole of the hinge base 1310 to engage and retain the hinge 1305 (and the TOLED panel). The pin-in-slot mechanism 1360 also allows to the hinge pin 1365 to be retracted to disengage the hinge 1305 so that the TOLED panel could be removed. The pin-in-slot mechanism 1360 includes a hinge pawl 1370 and a dowel pin 1375 used to attach the hinge pin 1365 to the hinge pawl 1370. Torsion springs 1380 maintain constant engagement of the hinge pin 1365. A lock set screw can be used to lock the hinge pin 1365 in place. A set screw 1390 is inserted in the hinge pawl 1370, and has an indented end to receive the hex key 1320. The hex key 1320 is used to activate the pin-in-slot mechanism 1360 to extend the hinge pin 1365 to engage and retain the hinge 1305 (and the TOLED panel) or to retract the hinge pin 1365 to disengage the hinge 1305 so that the TOLED panel could be removed.

As further shown in FIG. 13A, the hinge base lid 1315 could be attached to the hinge base 1310 using screws 1395.

Figure 13B:
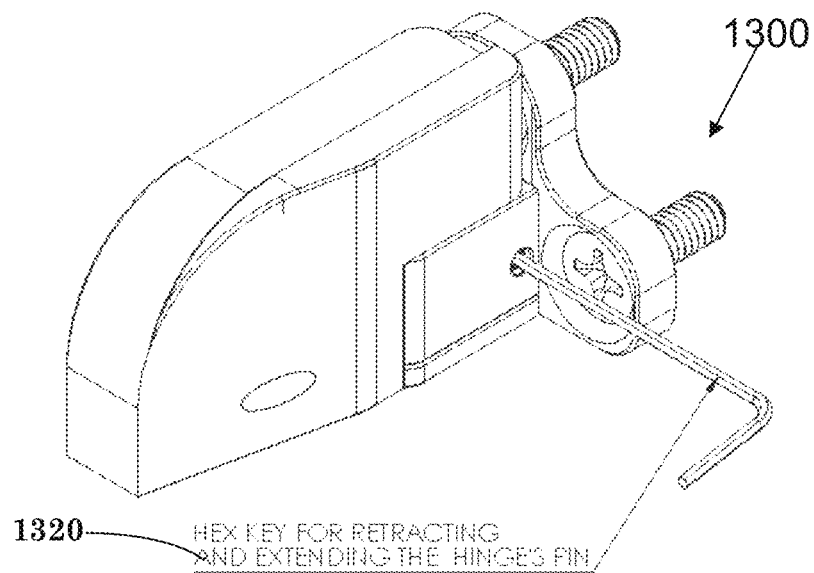
FIG. 13B is a perspective view of an assembled alternative hinge assembly shown in FIG. 13 according to one exemplary embodiment.

FIG. 13B is a perspective view of an assembled hinge assembly 1300 according to one exemplary embodiment. Hex key 1320 is inserted into the hinge assembly 1300 to activate the pin-in-slot mechanism (shown as element 1360 in FIG. 13A) for retracting or extending the hinge pin (shown as element 1365 in FIG. 13A).

Figure 13C:
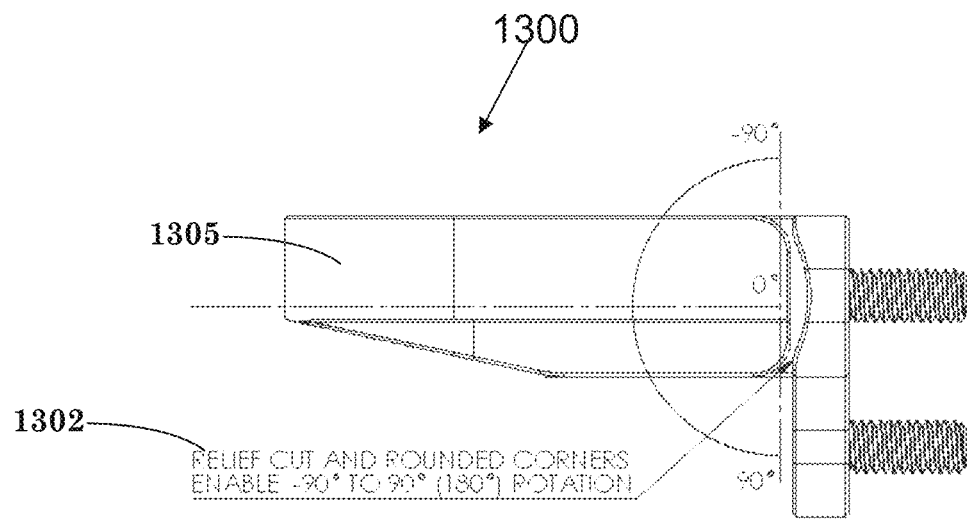
FIG. 13C is a top view of the hinge assembly shown in FIG. 14A according to one exemplary embodiment.

FIG. 13C is a top view of the hinge assembly 1300 according to one exemplary embodiment. The relief cut and rounded corners 1302 enable an approximately 180-degree rotation of the hinge 1305 in the range of about −90 degrees to about 90 degrees.

Figure 13D:
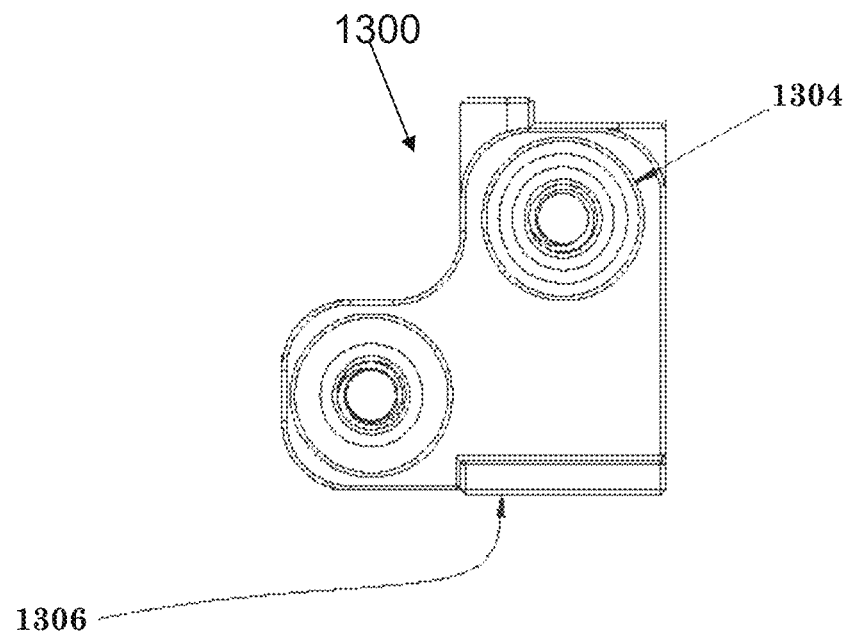
FIG. 13D is a back view of the hinge assembly shown in FIG. 14A according to one exemplary embodiment.

FIG. 13D is a back view of the hinge assembly 1300 according to one exemplary embodiment. The back of the hinge assembly includes circular cavities 1304 for flush mounting against the window's frame or mullion (shown as element 430 in FIG. 4). The flat surface 1306 allows side-to-side mounting for video wall applications.

Figure 13E:
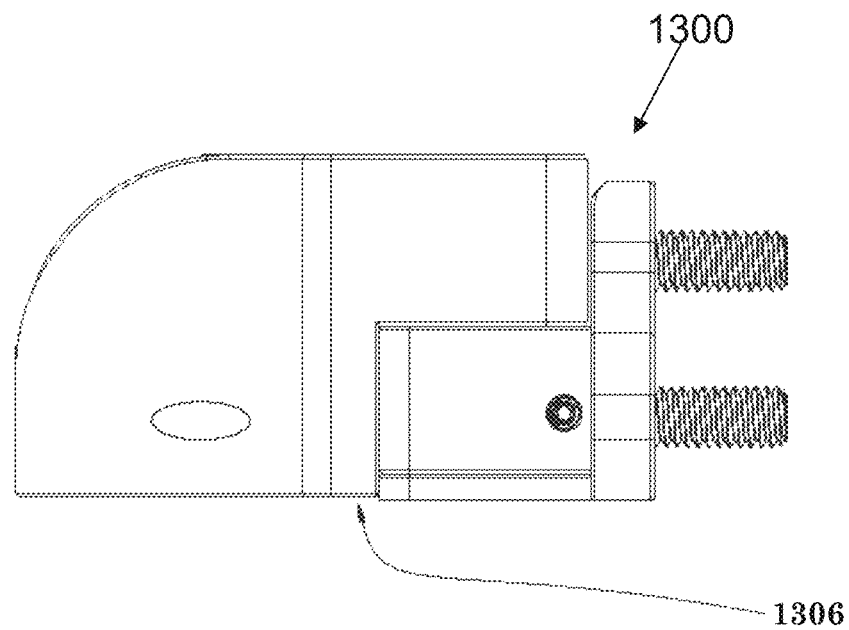
FIG. 13E is a side view of the hinge assembly shown in FIG. 14A according to one exemplary embodiment.

FIG. 13E is a side view of the hinge assembly 1300 according to one exemplary embodiment. The flat surface 1306 allows side-to-side mounting for video wall applications.

Figure 13F:
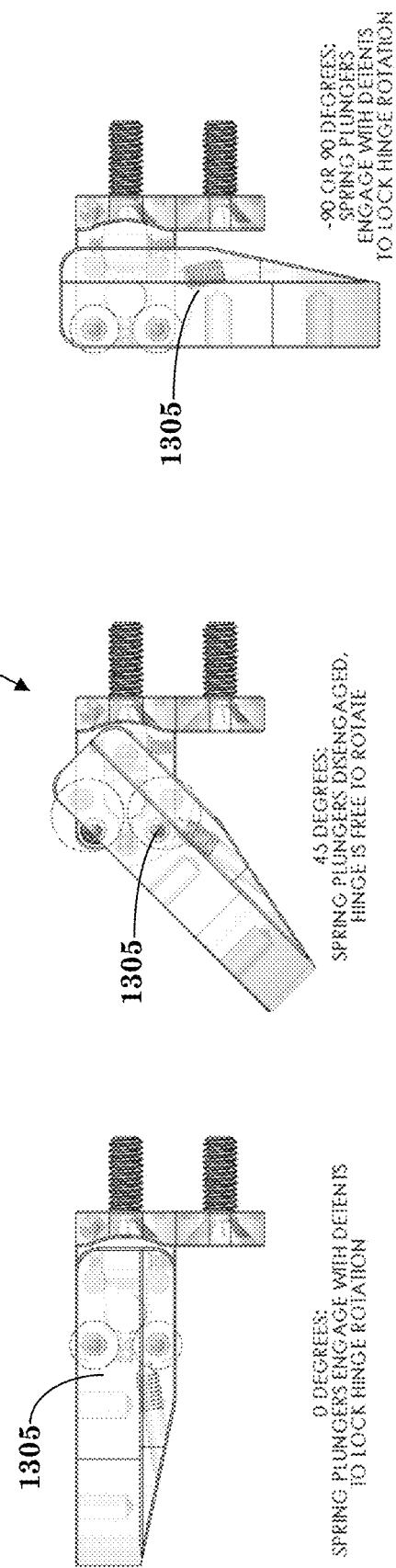
FIG. 13F illustrates various hinge rotation positions of the hinge assembly shown in FIGS. 13A-13E from a top view perspective according to one exemplary embodiment.

FIG. 13F illustrates various hinge rotation positions of the hinge assembly 1300 from a top view perspective according to one exemplary embodiment. As shown in the left illustration of FIG. 13F, when the hinge (or hinge mechanism) 1305 is at an approximately zero degree position, the spring plungers (shown as element 1340 in FIG. 13A) engage the catches or detents (shown as element 1335 in FIG. 13A) to temporarily lock the hinge (or hinge mechanism) 1305 in place and prevent the hinge 1305 (and the TOLED panel) from rotating. The middle illustration of FIG. 13F shows the hinge (or hinge mechanism) 1305 at an approximately 45-degrees position. At an approximately 45-degrees position, the spring plungers disengage and allow the hinge 1305 (and the TOLED panel) to rotate. The middle illustration of FIG. 13F shows the hinge 1305 at an approximately 90-degrees (or minus 90-degrees) position, where the spring plungers engage the catches or detents to temporarily lock the hinge (or hinge mechanism) 1305 in place and prevent the hinge (and the TOLED panel) from rotating.

Figure 13G:
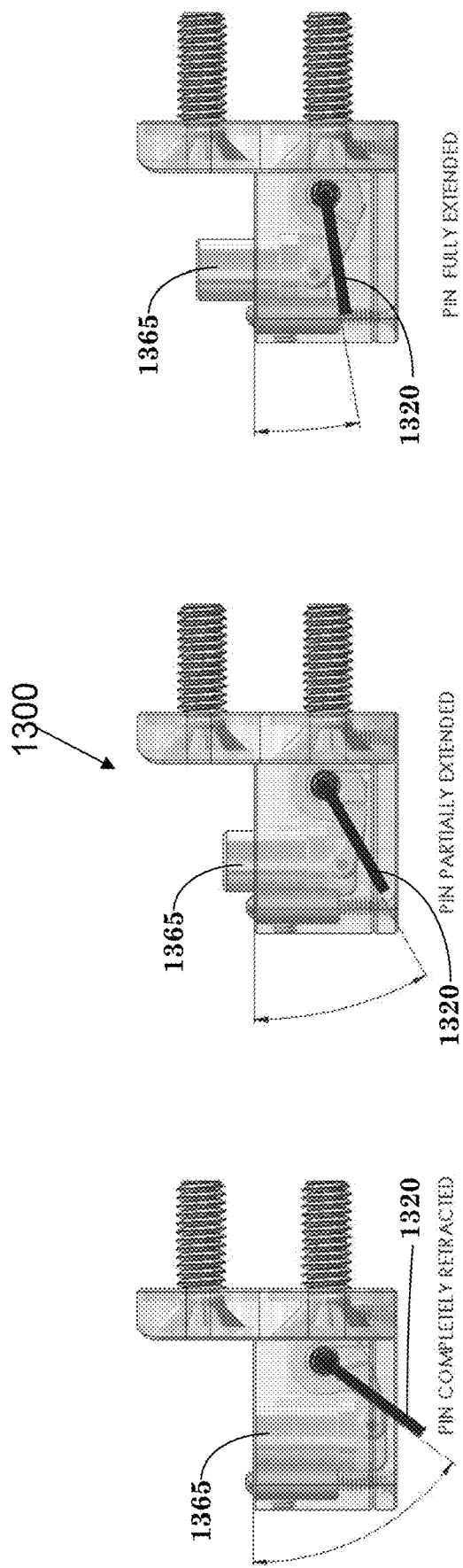
FIG. 13G illustrates various hinge pin engage/disengage positions of the hinge assembly shown in FIGS. 13A-13E from a side view perspective according to one exemplary embodiment.

FIG. 13G illustrates various hinge pin engage/disengage positions of the hinge assembly 1300 from a side view perspective according to one exemplary embodiment. The left illustration of 13G shows the hinge pin 1365 in a retracted position. The middle illustration of 13G shows the hex key 1320 being moved in a clock-wise direction to partially extend the hinge pin 1365. The right illustration of 13G shows the hex key 1320 being further move in a clock-wise direction to fully extend the hinge pin 1365.

Figure 14A:
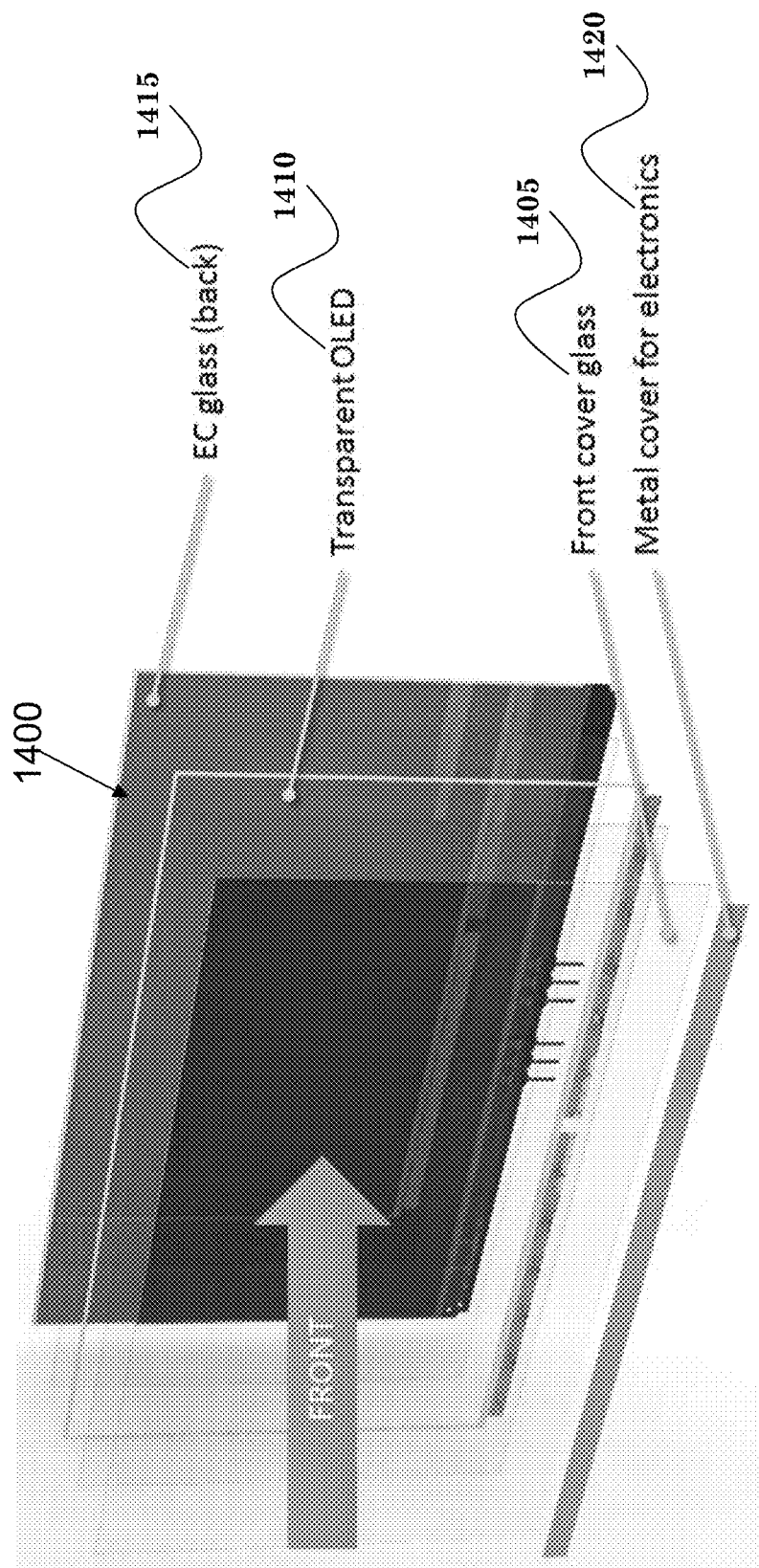
FIG. 14A illustrates a TOLED display assembly incorporating a transparency control medium for transparency control according to one exemplary embodiment.

As illustrated in FIGS. 12A and 12B and discussed in the above text describing the figures, in one embodiment, a privacy coating/film 1240 could be applied to block visibility of content or background from the back of the TOLED panel. FIG. 14A illustrates an alternative embodiment where a transparency control medium 1415 can be used to provide transparency control to the TOLED panel according to one exemplary embodiment. In one embodiment, the transparency control medium 1415 can be electrochromic (EC) glass, Suspended Particle Device (SPD) film, or Polymer Dispersed Liquid Crystal (PDLC) film. As shown in FIG. 14A, the front of the TOLED assembly 1400 includes the front cover glass 1405 attached to the TOLED panel 1410. The front of the TOLED assembly 1400 also includes a metal cover 1420 for electronics. In the back of the TOLED assembly 1400, the transparency control medium 1415 is attached to the back of the TOLED panel 1410.

Content displayed on TOLEDs is generally difficult to see when there is a bright background or any other source of bright light behind the display. In particular, for TOLEDs installed on windows facing the outside of a building, the image on the screen would typically be washed out by the background. The incorporation of a transparency control medium (as illustrated in FIG. 14A) such as electrochromic (EC) coated glass, a Suspended Particle Device (SPD) film or a Polymer Dispersed Liquid Crystal (PDLC) film allows TOLED transparency to be regulated in a controlled manner. In general, when content needs to be visible on the TOLED panel, the transparency control medium can be tinted to partially block some of the background light. When the TOLED display is turned off or needs to be transparent, the transparency control medium can be disabled or un-tinted. Furthermore, certain transparency control mediums such as Electrochromic coated glass or Suspended particle device films can be partially tinted to closely match the environment lighting conditions. The transparency control medium of choice can be controlled with ambient light sensors, timers or even manually overridden as needed. The TOLED and the transparency control medium are mechanically coupled together via an optical bonding process. However, their functionality is independent of each other, i.e., one can be in an ON state while the other remains in an OFF state and vice versa.

EC Glass

EC glass can generally block up to 99% of ultraviolet (UV) light which would help to extend the life of the TOLED panel when installed on a window exposed to direct sunlight. By incorporating or integrating the EC glass into the TOLED assembly (shown as element 1400 in FIG. 14A), the transparency can be controlled regardless of where the TOLED panel (shown as element 1410 in FIG. 14A) is used (e.g., on a table top, or mounted on a window, etc.).

EC glass generally requires a low voltage (<3.3 v) electric current applied to it in order to start the tinting process. By regulating the voltage of the electric current, different tinting levels of the EC glass can be achieved. When no electric current is applied, the tinting on the EC glass disappears. Typical EC glass has a transmittance range of 60% (not tinted) to 2% (fully tinted).

Figure 14B:
FIGS. 14B-14D illustrate exemplary installations of a TOLED display on an EC smart window in various tinting states according to one exemplary embodiment.
Figure 14C:
Figure 14D:

FIGS. 14B-14D illustrate exemplary installations of a TOLED display with electrochromic transparency control capabilities installed on a conventional office window. Different tinting states are shown according to one exemplary embodiment. FIG. 14B shows a TOLED display with transparency control that has its TOLED element turned OFF and its EC glass element set to zero percent tint (full transparency), installed on a conventional window, resulting in approximately 24 percent overall transparency. FIG. 14C shows a TOLED display with transparency control that has its TOLED element turned ON and its EC glass element set to zero percent tint (full transparency), installed on a conventional window, resulting in approximately 24 percent overall transparency. As shown in FIG. 14C, even though the TOLED display is turned on, the content on the TOLED display is washed out and difficult to see due to the bright background condition and the lack of tinting on the TOLED's EC glass.

FIG. 14D shows a TOLED display with transparency control that has its TOLED element turned ON and its EC glass element set to ~25 percent tint (75% of max possible transparency), installed on a conventional window, resulting in approximately 18 percent overall transparency. As shown FIG. 14D, the TOLED display is turned ON, and the content on the TOLED display is slightly more visible (less washed out) because the EC glass on the back of the TOLED is partially tinted.

FIG. 14E shows a TOLED display with transparency control that has its TOLED element turned ON and its EC glass element set to ~75 percent tint (25% of max possible transparency), installed on a conventional window, resulting in less than 12 percent overall transparency. As shown in FIG. 14E, the content on the TOLED display is quite visible because there is significant tinting on the TOLED's EC glass element (~75%). The visibility of the content on the TOLED display is higher in FIG. 14D than in FIG. 14C since the EC glass in FIG. 14D has a higher tint level. FIG. 14F shows a TOLED display with transparency control that has its TOLED element turned OFF and its EC glass element set to ~75 percent tint (25% of max possible transparency), resulting in less than 12 percent overall transparency. As shown in FIG. 14F, the TOLED display is turned OFF, and transparency is somewhat obscured (especially in comparison to the transparency shown in FIG. 14B with zero percent tint) due to the higher tint level on the EC glass.

SPD Film

Similar to like EC glass technology, Suspended Particle Device (SPD) films can be incorporated to the back of a TOLED display as a transparency control medium to achieve a transparency controllable TOLED display.

Suspended Particle Device (SPD) films can operate with alternate current and voltages in the range of <110V AC. Typical transmittance of SPD films is 45-51% in their ON state and <1% in their OFF state. Current must be constantly applied for the SPD Film to remain in its transparent or un-tinted state. In one embodiment, SPD films may have a response (switching) time of about 3 seconds when switching between their OFF (no transmittance) state and their ON (max transmittance) state. SPD Films can generally block up to 99% of ultraviolet (UV) light which would help to extend the life of the TOLED panel when installed on a window exposed to direct sunlight.

PDLC Film

Similar to SPD films, Polymer Dispersed Liquid Crystal (PDLC) films can be used as a transparency control medium. PDLC films can operate with alternate current and voltages in the range of about 30-70V AC. PDLC films can have a typical maximum transmittance of about 80-90%. PDLC Films can generally block up to 99% of ultraviolet (UV) light which would help to extend the life of the TOLED panel when installed on a window exposed to direct sunlight. The thickness and overall morphology of the PDLC film may have a significant effect in the overall maximum and minimum transmittance of the film. This could potentially allow for the use of different thickness of PDLC films dependent of the intended application of a specific TOLED display. For instance, a TOLED display meant for indoor use could be coupled to a thin PDLC film which would allow for superior transmissivity at the cost of lower transparency control, which is not as critical for indoor environments as it is for outdoor use where the environment is usually very bright and full transparency control is a must to facilitate the visibility of the TOLED display content under any lightning conditions.

Figure 15A:
FIG. 15A illustrates possible different ways that a TOLED display could be installed and used according to one exemplary embodiment.
Figure 15B:
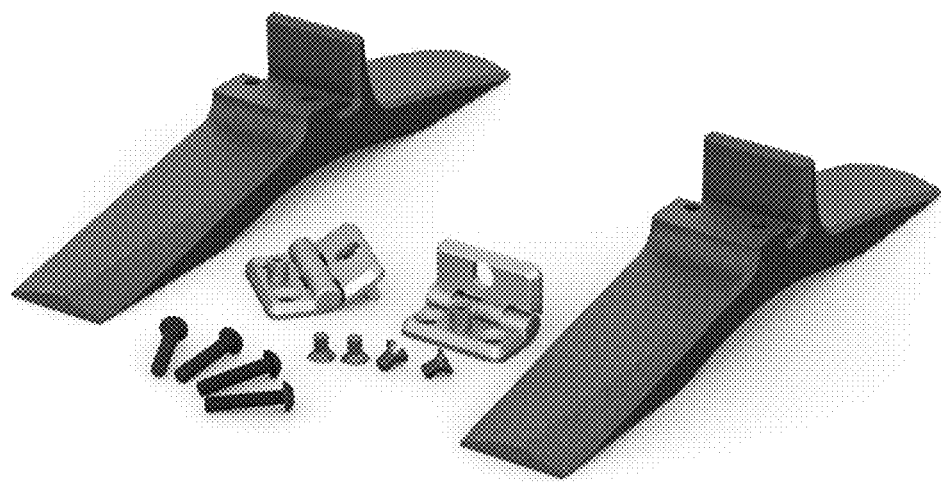
FIG. 15B shows parts or components that could be used with a versatile mounting system in a desktop configuration or in a window mount configuration according to one exemplary embodiment.

FIG. 15A illustrates possible different ways that the TOLED display or monitor could be installed and used. As shown in FIG. 15A, the TOLED display or monitor could be used in a desktop or tabletop configuration, or could be mounted on a window in portrait or landscape mode. FIG. 15B shows parts or components (including stand legs and mounting hinges) that could be used with a versatile mounting system in a desktop configuration or in a window mount configuration.

Figure 16A:
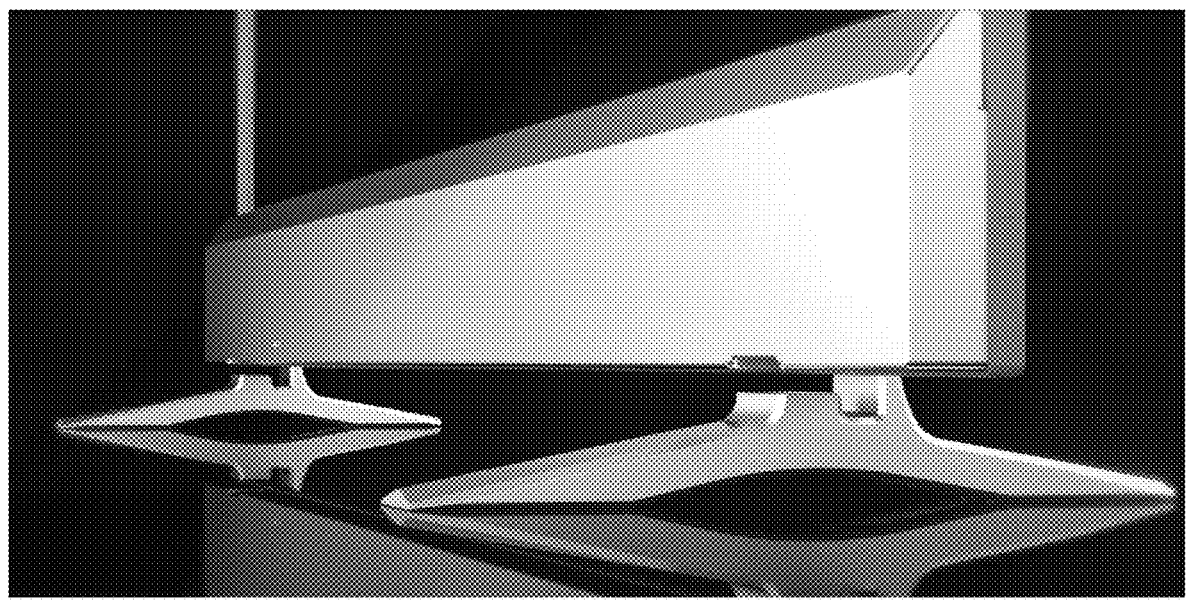
FIGS. 16A and 16B illustrate a versatile mounting system in a desktop configuration with exemplary leg stands attached to the TOLED display according to one exemplary embodiment.
Figure 16B:
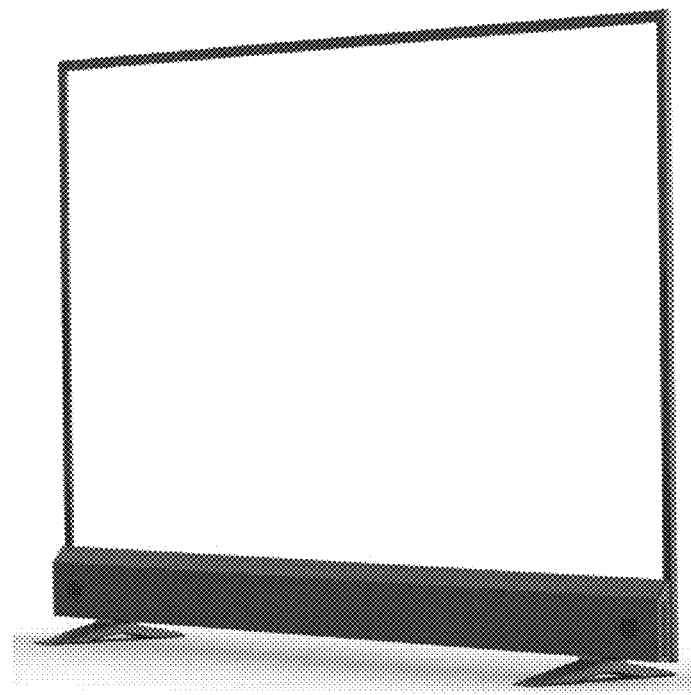
Figure 16C:
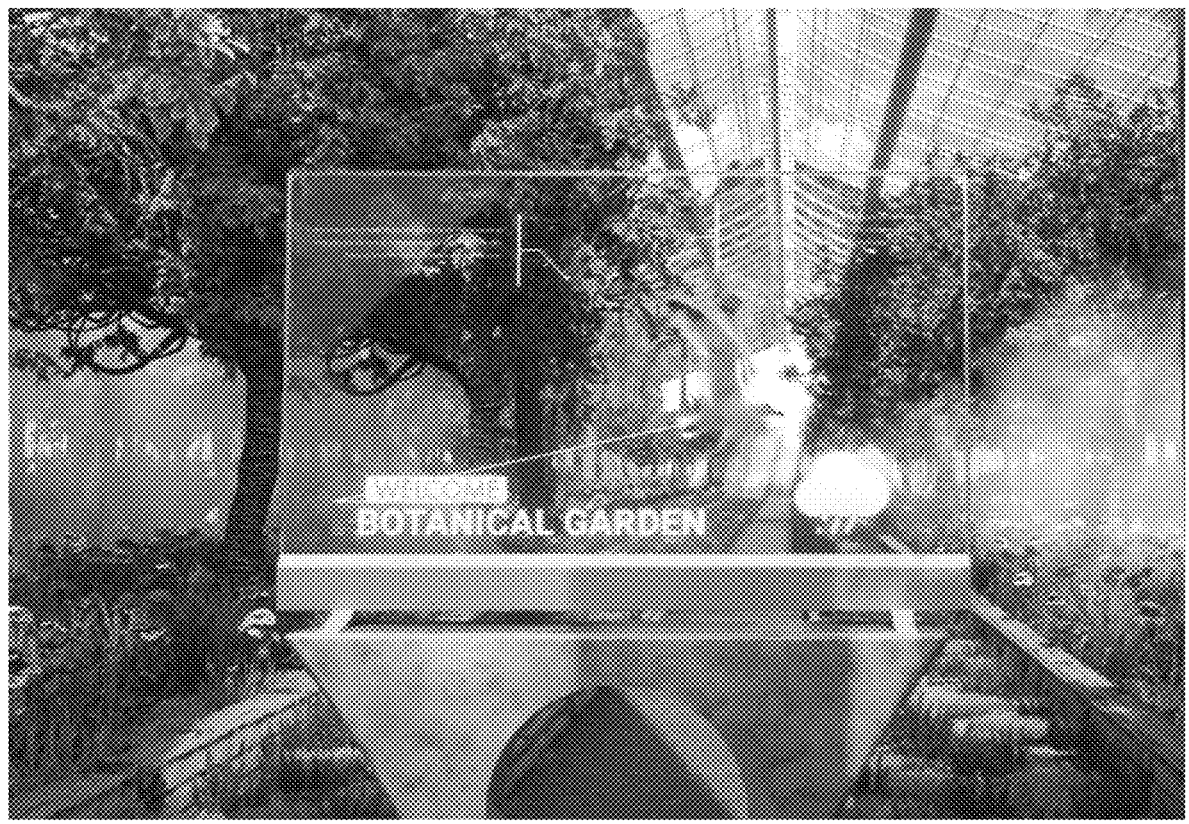
FIG. 16C shows a TOLED display in a desktop configuration according to one exemplary embodiment.

FIGS. 16A and 16B illustrate an exemplary versatile mounting system in a desktop configuration with leg stands attached to the TOLED display. FIG. 16C shows an exemplary TOLED display in its desktop configuration.

Figure 17A:
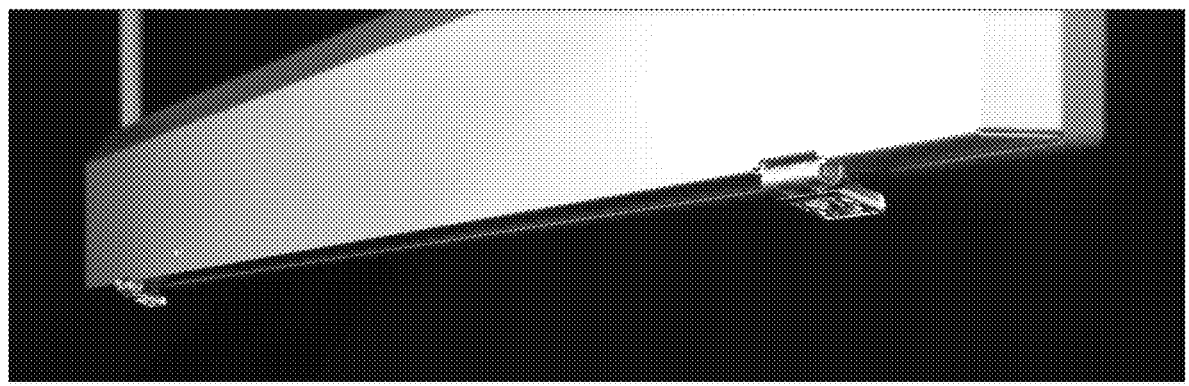
FIG. 17A illustrates a versatile mounting system in a window mount configuration with mounting hinges attached to the TOLED display according to one exemplary embodiment.
Figure 17B:
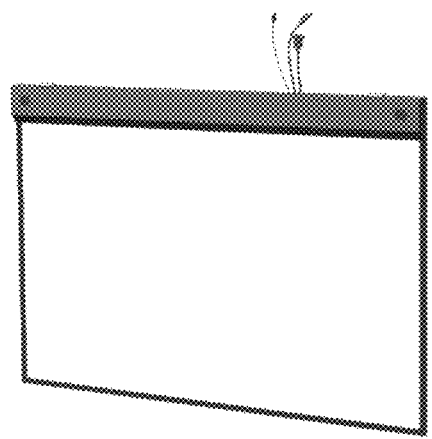
FIG. 17B shows a TOLED display in a window mount configuration with mounting hinges attached to the mounting points of the versatile mounting system according to one exemplary embodiment.
Figure 17C:
FIG. 17C shows a TOLED display in a window mount configuration according to exemplary embodiment.

FIG. 17A illustrates an exemplary versatile mounting system in a window mount configuration with mounting hinges attached to the TOLED display. FIG. 17B shows the TOLED display in a window mount configuration with mounting hinges attached to the mounting points of the versatile mounting system. FIG. 17C shows an exemplary TOLED display in its window mount configuration.

Figure 17D:
FIGS. 17D and 17E illustrate a configuration where multiple TOLED displays are installed in portrait mode using the mounting hinges shown in FIG. 17A according to one exemplary embodiment.
Figure 17E:

FIGS. 17D and 17E show an exemplary configuration where multiple TOLED displays are installed in portrait mode using the mounting hinges shown in FIG. 17A. In FIG. 17D, the TOLED displays are shown in their normal "closed" position, acting as an interactive door for the showcase exhibit. In FIG. 17E, the TOLED displays are shown in their rotated configuration (or "opened" position), which allows the user to access the merchandise inside the showcase exhibit behind the TOLED display.

Projective Capacitive Touch (PCAP) is an established technology used on smartphones (e.g. iPhones). A PCAP panel generally consists of a pair of sensor films laminated to the rear of a cover glass and an integrated circuit (IC) controller to allow a computing device to interface with the PCAP panel. PCAP panels are typically bonded or attached to the front of displays. There are other touch technologies in the marketplace, including resistive, infrared, acoustic, etc.

Figure 18:
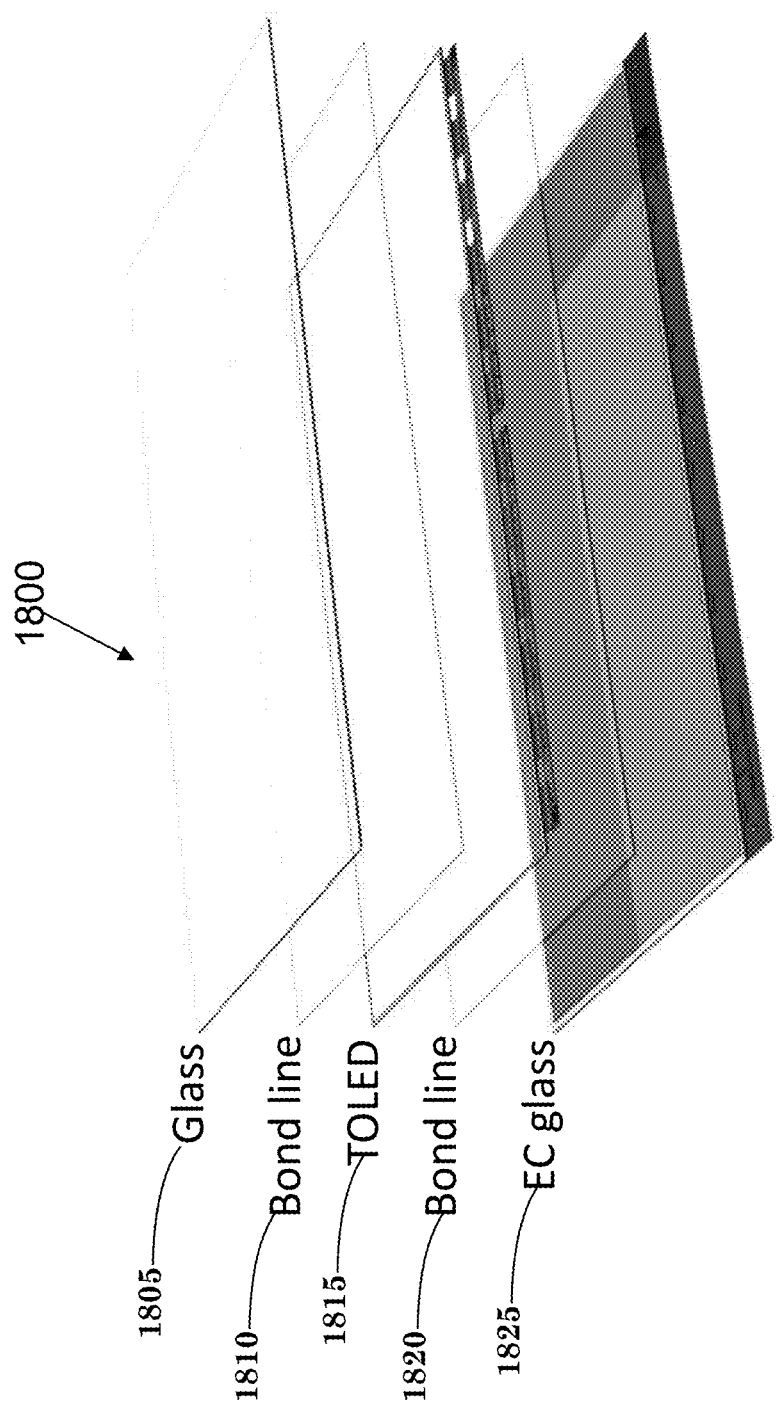
FIG. 18 illustrates a TOLED display assembly without a PCAP touch panel according to one exemplary embodiment.
Figure 19:
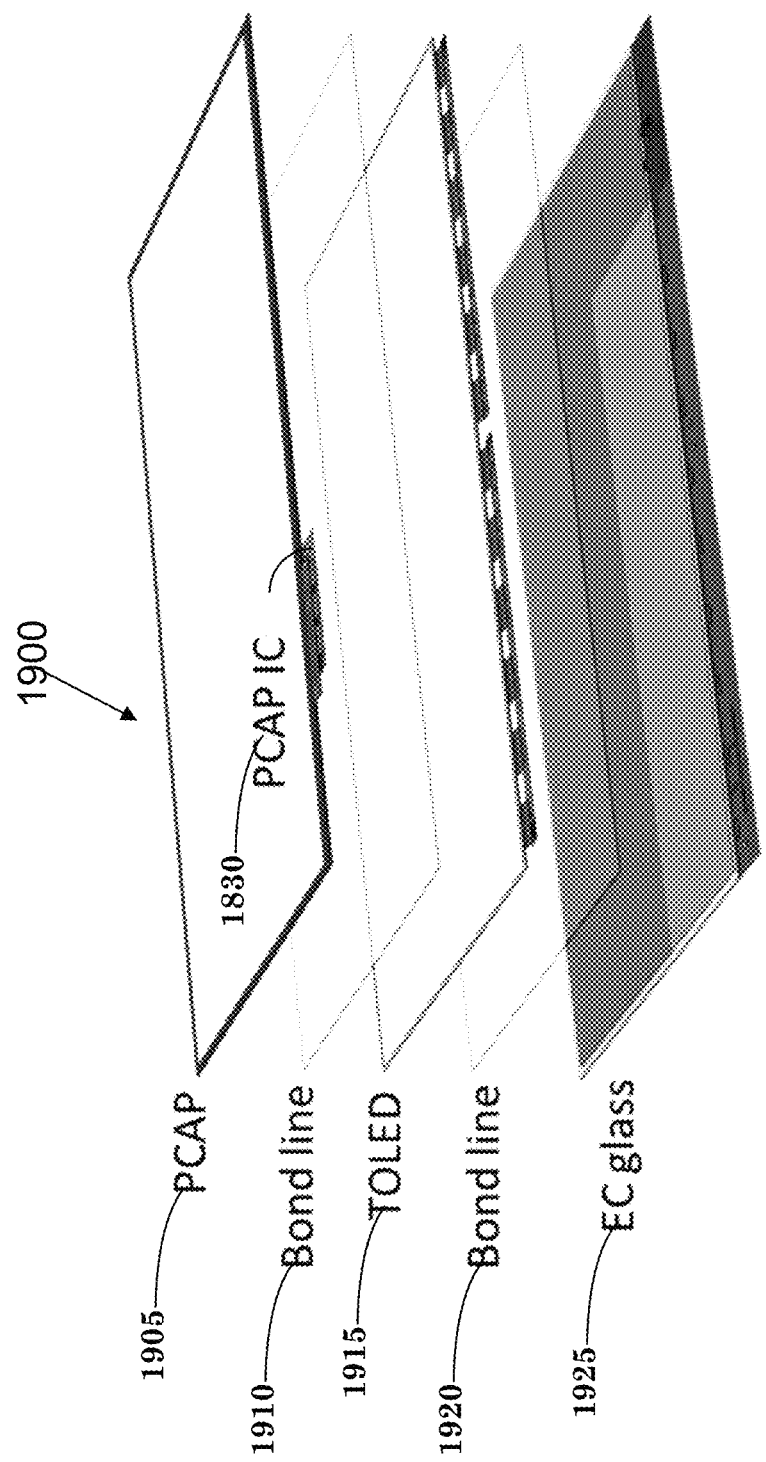
FIG. 19 illustrates a TOLED display assembly with a PCAP touch panel according to one exemplary embodiment.

FIG. 18 shows an exemplary TOLED display assembly 1800 with no PCAP touch capability. As shown in FIG. 18, the TOLED display assembly 1800 includes the cover glass 1805, a first bond layer 1810, a TOLED panel 1815, a second bond layer 1820, and an EC glass 1825. FIG. 19 shows an exemplary TOLED display assembly 1900 with PCAP touch capability. As shown in FIG. 19, the cover glass (shown as element 1805 in FIG. 18) is replaced with a PCAP touch panel 1905, which includes a cover glass, sensor, and a PCAP IC controller 1930 to control and/or drive the PCAP touch panel 1905. In addition to the PCAP touch panel 1905, the TOLED display assembly includes a first bond layer 1920, a TOLED panel 1915, a second bond layer 1925, and an EC glass 1925.

Figure 20:
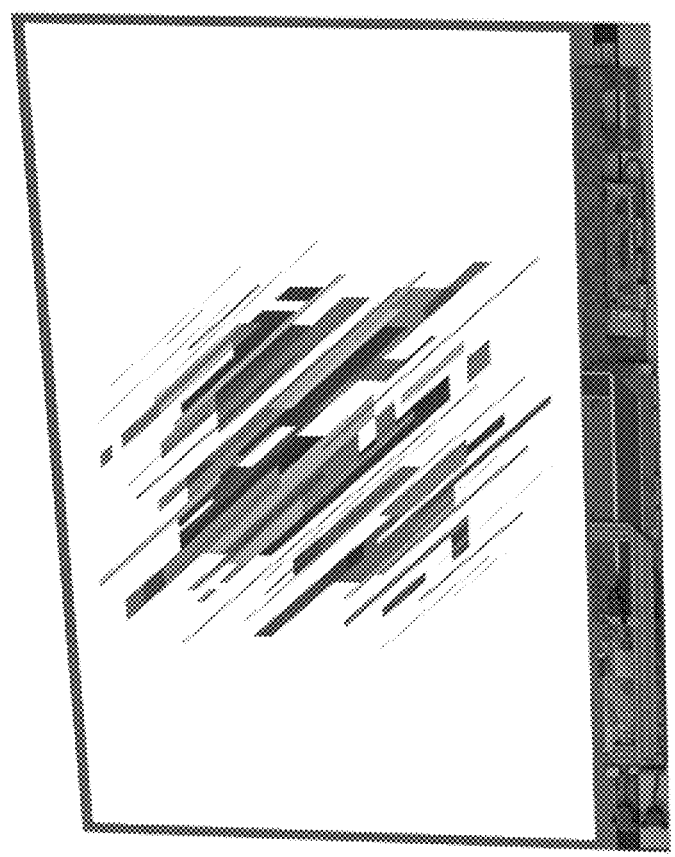
FIG. 20 illustrates a TOLED display assembly with a PCAP touch panel according to one exemplary embodiment and with a PCAP IC controller embedded in electronics for the TOLED display assembly.

With the addition of the PCAP touch panel 1905, the PCAP IC controller 930 should be bundled into the TOLED display assembly 1900. As shown in FIG. 20, additional space needed to house the PCAP IC controller 1930 (shown in FIG. 19) provides sufficient space to house the rest of the electronics needed to control the TOLED panel 1915 (shown in FIG. 19) and the tinting and transparency of the EC glass 1925 (shown in FIG. 19).

Figure 21:
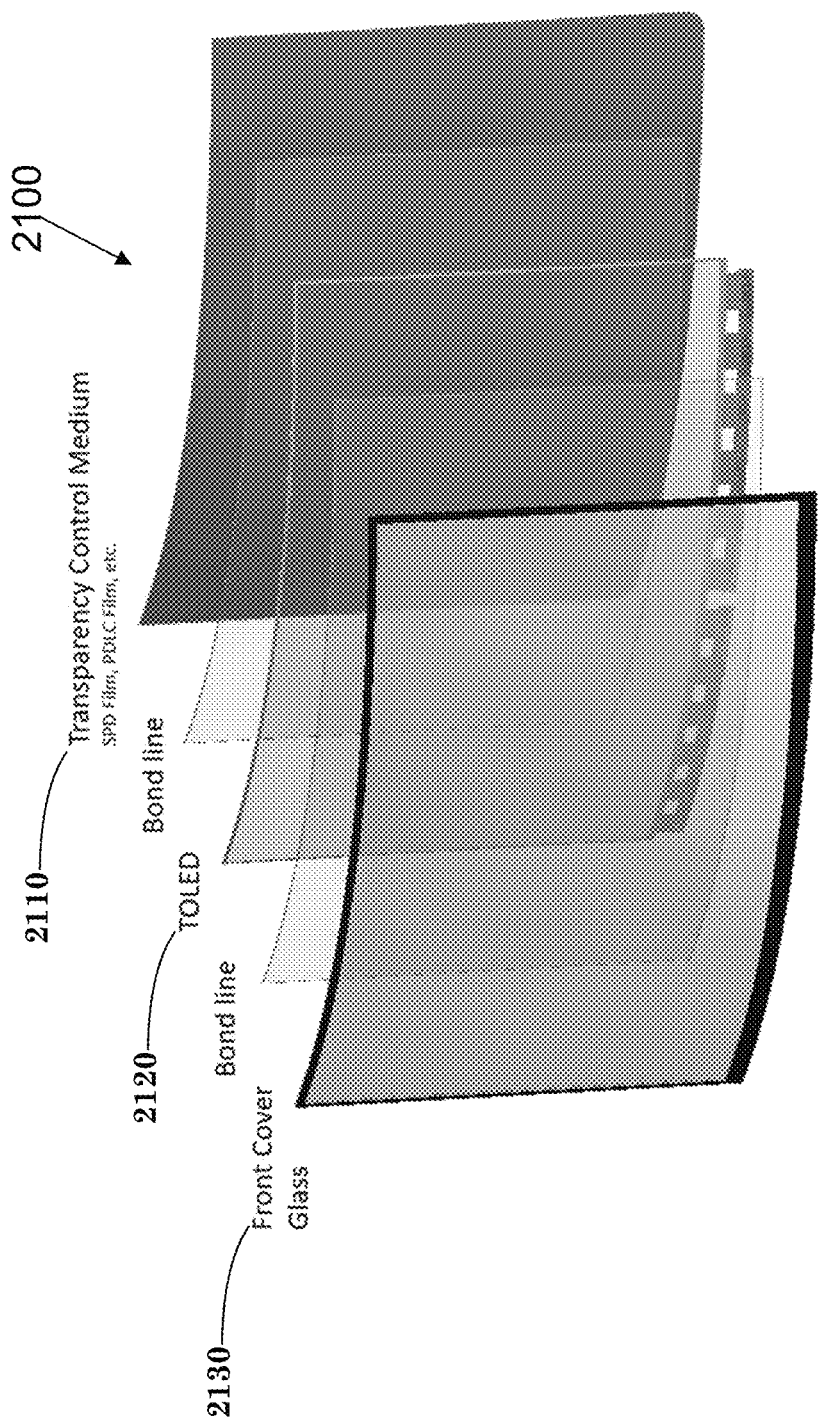
FIG. 21 illustrates a curved TOLED display assembly incorporating a transparency control medium for transparency control according to one exemplary embodiment.

FIG. 21 illustrates an alternative embodiment of a TOLED assembly (shown as element 2100 in FIG. 21) where a transparency control medium 2110 can be used to provide transparency control to the curved TOLED panel according to one exemplary embodiment. In one embodiment, the transparency control medium 2110 can be Suspended Particle Device (SPD) film, or Polymer Dispersed Liquid Crystal (PDLC) film to facilitate the curved geometry of the TOLED. As shown in FIG. 21, the front of the TOLED assembly includes the curved front cover glass 2130 attached to the curved TOLED panel 2120. In the back of the TOLED assembly, the transparency control medium 2110 is bonded to the back of the TOLED panel 2120 in a curved geometry.

Versatile Hinge Mechanism

Figure 22A:
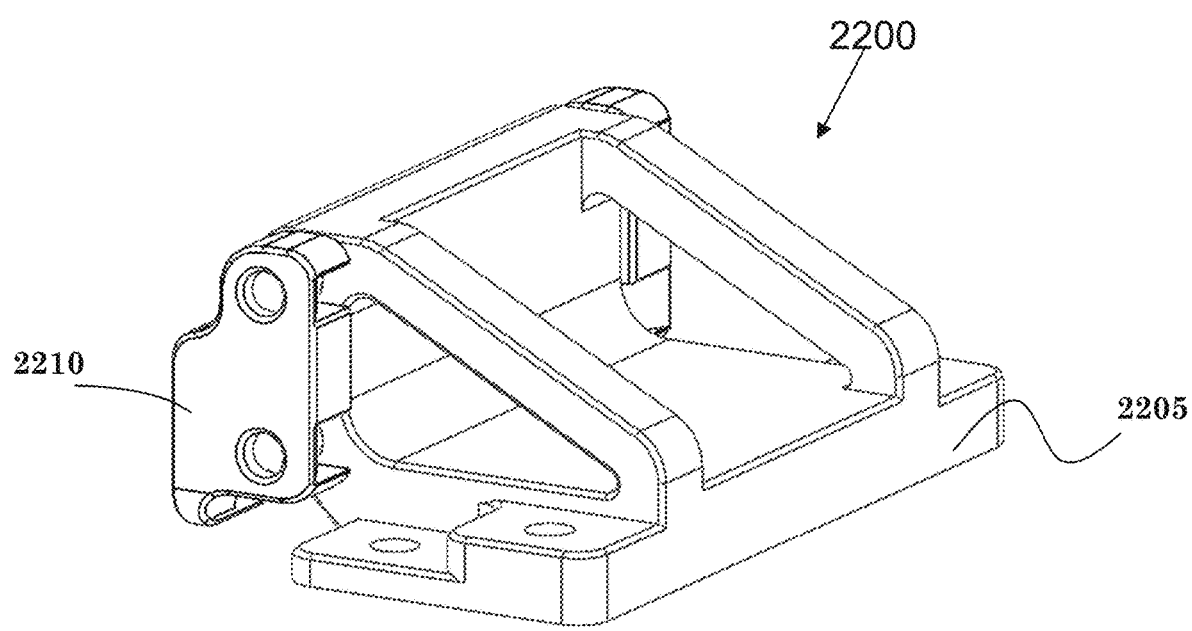
FIGS. 22A-22D illustrate a hinge mechanism assembly according to one exemplary embodiment
Figure 22B:
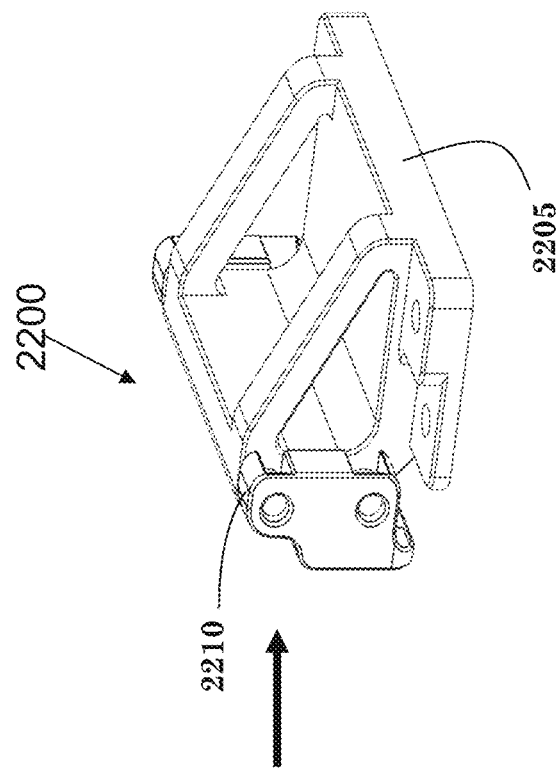
Figure 22B:
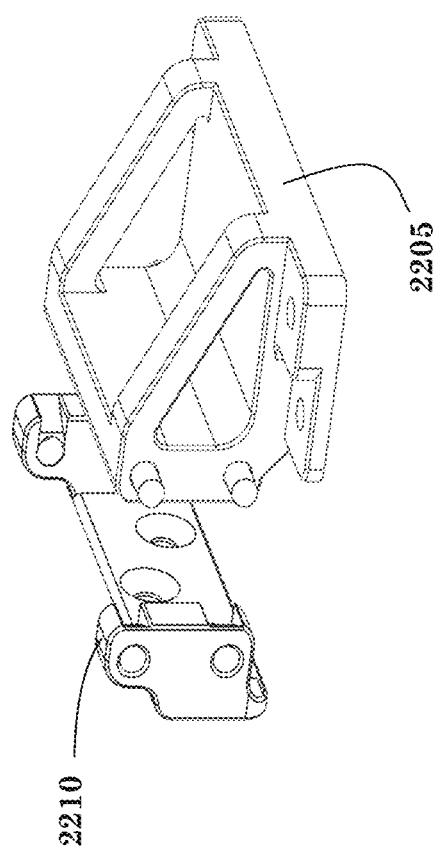

FIG. 22A shows a perspective view of a versatile hinge assembly 2200 according to one exemplary embodiment. The versatile hinge assembly 2200 consists of a mounted hinge base 2205 and a mating hinge 2210. The construction of the versatile hinge system 2200 according to one exemplary embodiment consists of snapping or coupling the mounted hinge base 2205 and the mating hinge 2210 together as shown in FIG. 22B.

Figure 22C:
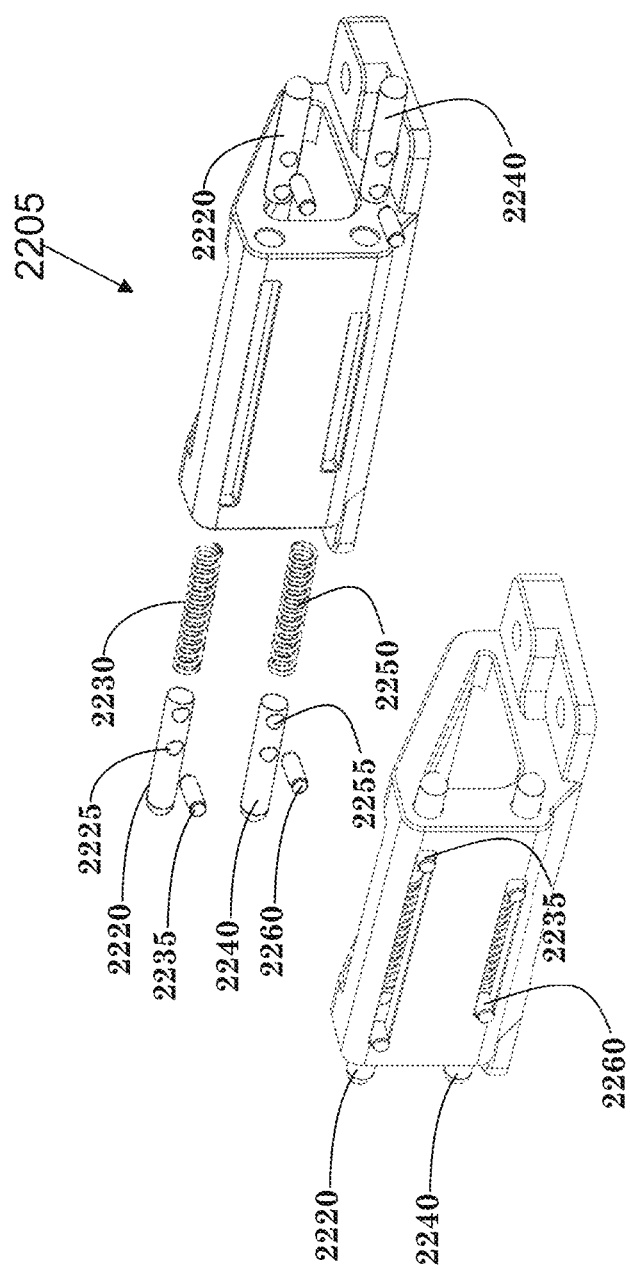
Figure 22D:
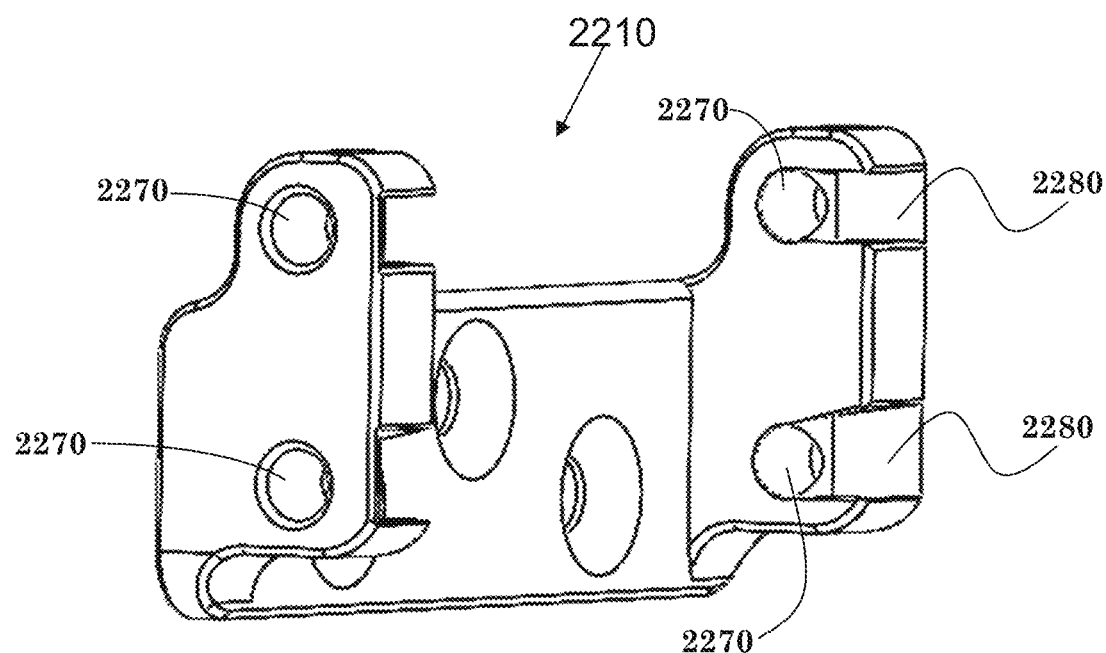

FIG. 22C shows a mounted hinge base 2205 according to one exemplary embodiment. The mounted hinge base 2205 would be attached to the display assembly. FIG. 22D shows a mating hinge 2210 according to one exemplary embodiment. The mating hinge 2210 would be attached to the desired structure where the display assembly would be mounted. As shown in FIG. 22C, the mounted hinge base 2205 includes a pair of engaging spring plungers 2220 coupled to the ends of a spring 2230, and a pair of locking spring plunger 2240 coupled to the ends of a spring 2250. The engaging spring plungers 2220 include cavities 2225 to receive pins 2235. Similarly, the locking spring plungers 2240 include cavities 2255 to receive pins 2260. The engaging spring plungers 2220 and the locking spring plungers 2240 retract and snap into the cavities 2270 on the mating hinge 2210 shown in FIG. 22D to couple the mounted hinge base 2205 and the mating hinge 2210 together as shown in FIG. 22B.

The spring plungers 2220 and 2240 can retract due to the inclined surfaces 2280 on the mating hinge as shown in FIG. 22D. When both pairs of spring plunger pins (top and bottom) 2220 and 2240 are engaged with the mating hinge 2210, the hinge mechanism assembly 2200 is in a locked position, as shown in FIG. 22B. When only the top or engaging spring plunger pins 2220 are engaged with the mating hinge 2210, the hinge mechanism assembly 2200 is in an unlocked position, as shown in FIG. 23C. When both pairs of spring plungers are disengaged from the mating hinge 2210, the mating hinge 2210 can be removed from the mounted hinge base 2205, as shown in FIG. 23E.

Figure 23A:
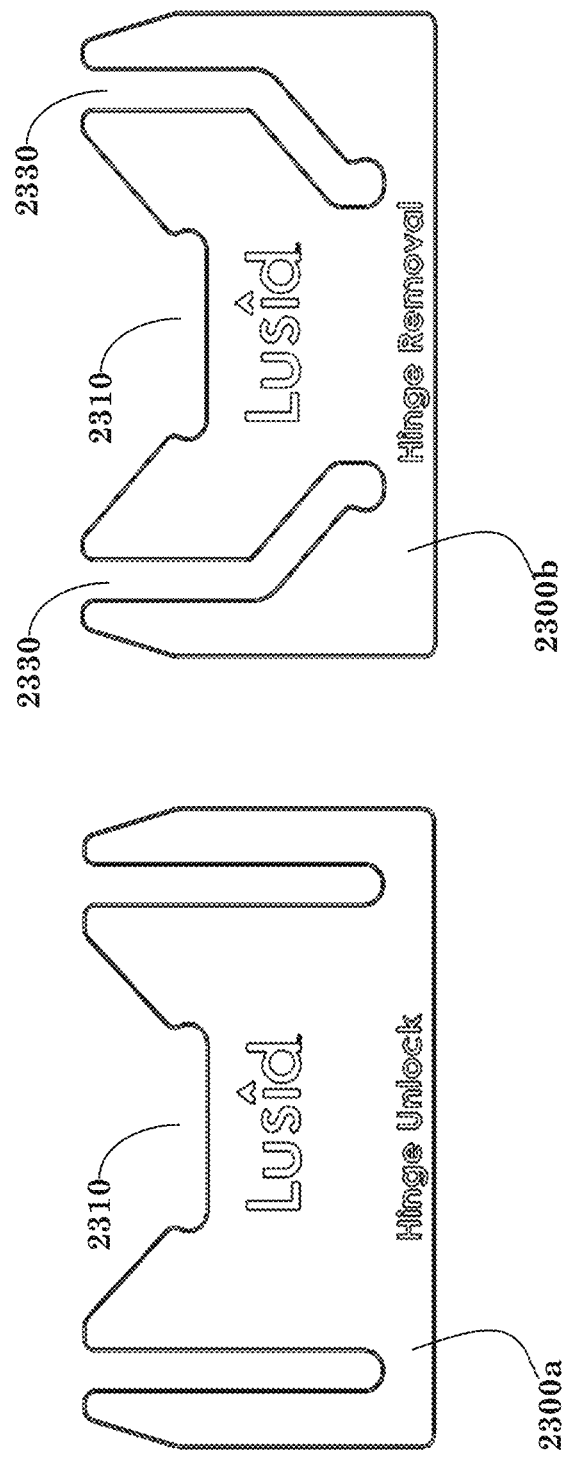
FIG. 23A illustrates key card variants according to one exemplary embodiment.
Figure 23B:
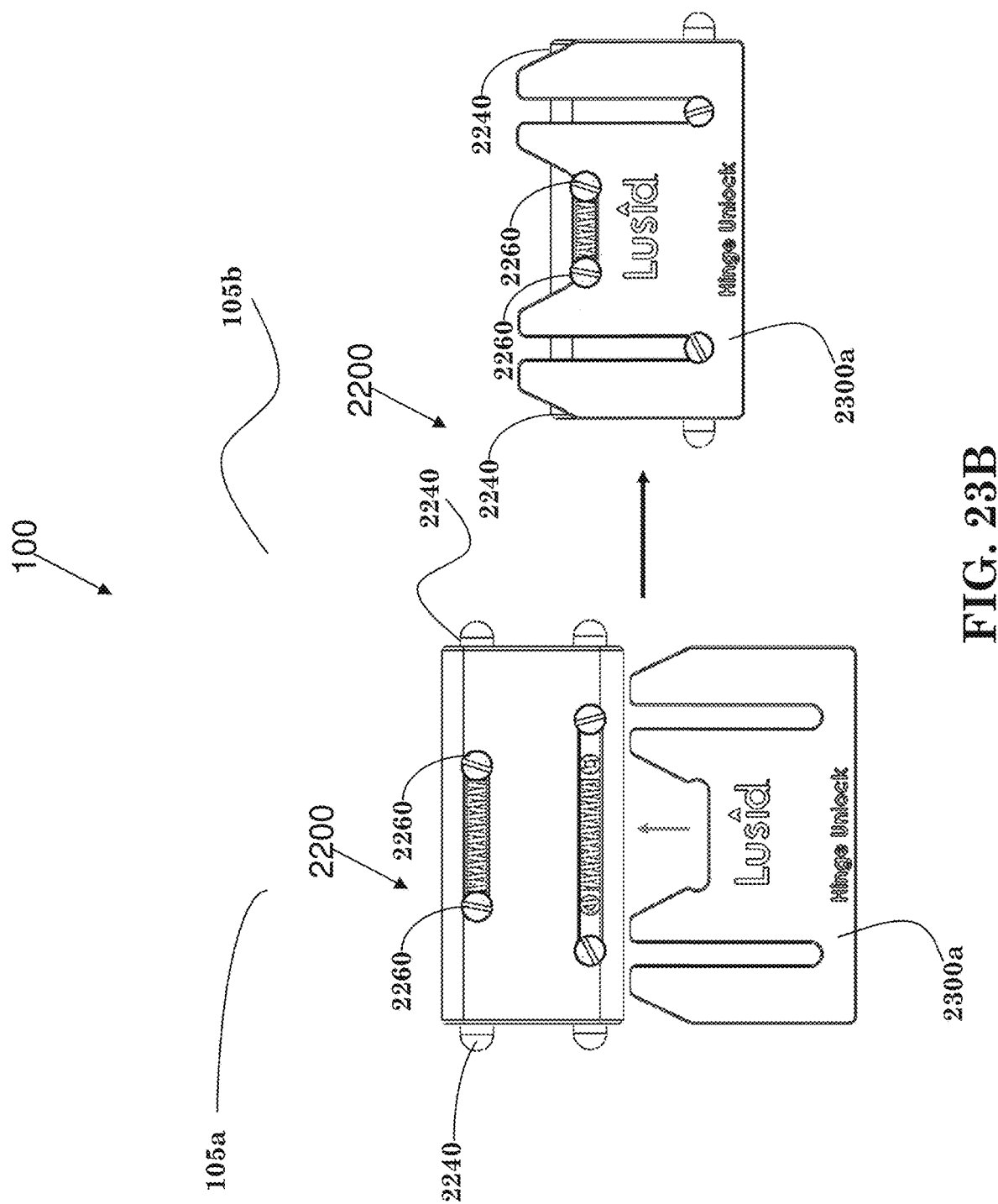
FIGS. 23B-23E shows different views of how key cards (shown in FIG. 23A) would be used to unlock the hinge mechanism assembly according to one exemplary embodiment.
Figure 23C:
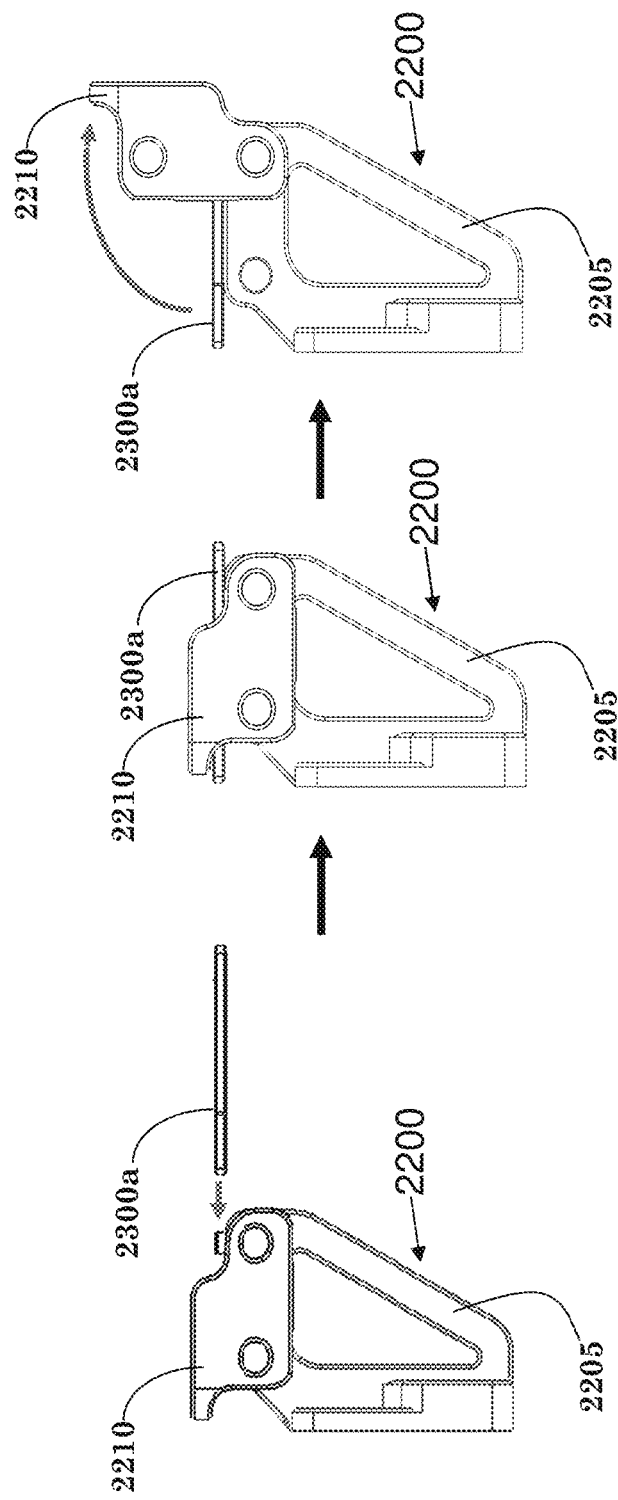

FIG. 23A shows unlock key card 2300a (labeled Hinge Unlock) and removal key card 2300b (labeled Hinge Removal), according to one exemplary embodiment, that can be used to disengage the pins, allowing the user to unlock and remove the display. As shown in FIG. 23B, the unlock key card 2300a is used to disengage only the locking spring plungers 2240 from the mating hinge 2210 allowing the display assembly (not shown) to be unlocked and rotated. As shown in FIG. 23B, the angled cut-out portion 2310 of the unlock key card 2300a engages the pins 2260 on the locking spring plungers 2240 and forces the pins 2260 closer together, causing the spring plungers 2240 to retract and disengage from the mating hinge 2210. When the locking spring plungers 2240 disengage from the mating hinge 2210, the mounted hinge base 2205 is unlocked and can be rotated as shown in FIG. 23C. As a result, the display assembly (not shown in FIG. 23C) attached to the mounted hinge base 2205 can be rotated.

Figure 23D:
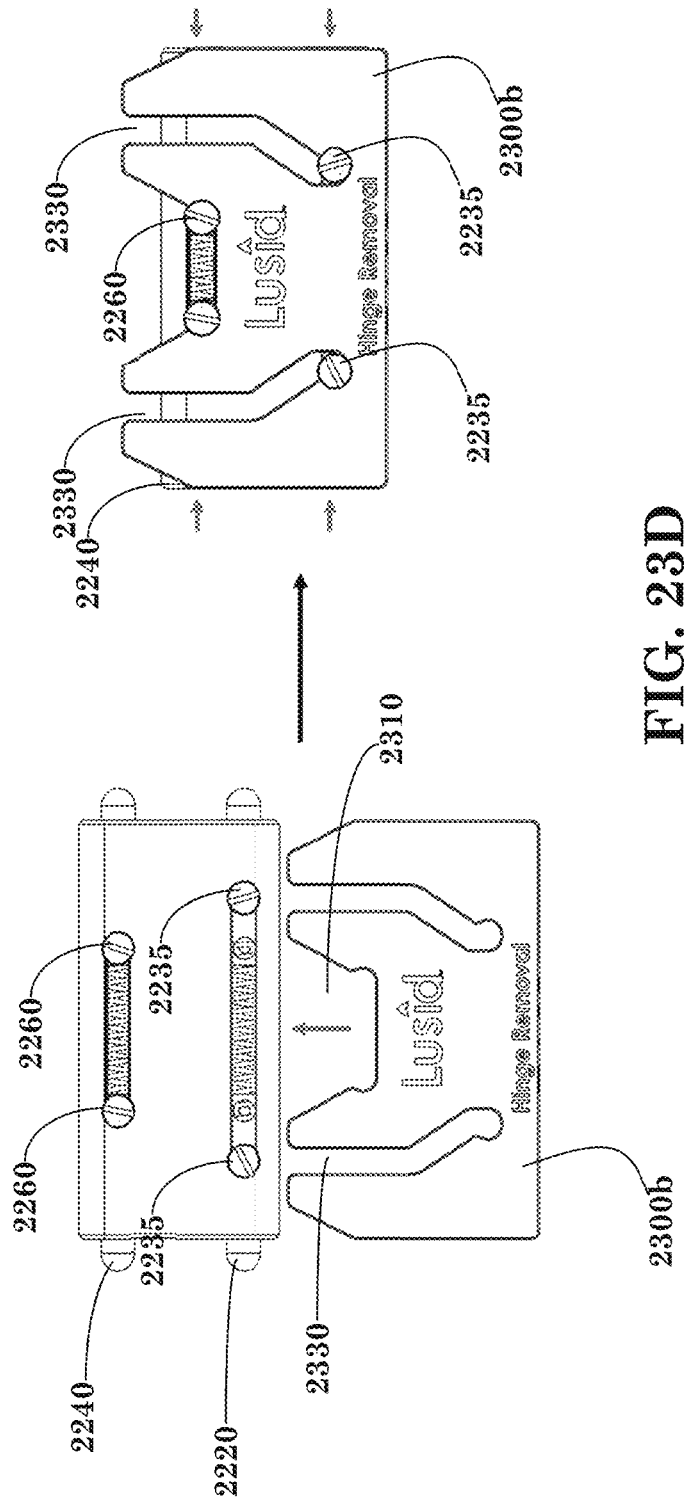
Figure 23E:
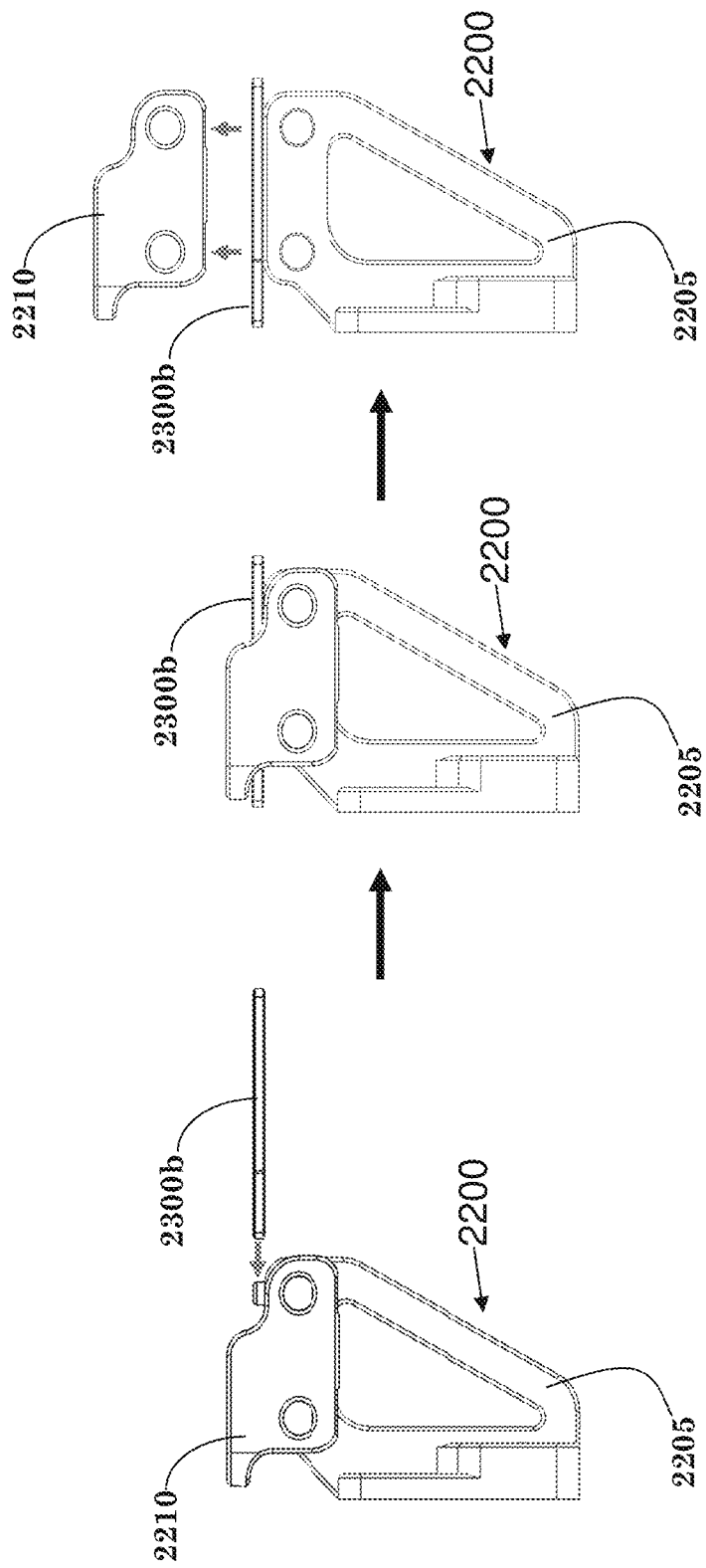

As shown in FIG. 23D, the removal key card 2300b is used to disengage both the locking spring plungers 2240 and the engaging spring plungers 2220 from the mating hinge 2210 allowing the display assembly (not shown) to be disengaged and removed. As shown in FIG. 23D, the angled cut-out portion 2310 of the removal key card 2300b engages the pins 2260 on the locking spring plungers 2240 and forces the pins 2260 closer together, causing the spring plungers 2240 to retract and disengage from the mating hinge 2210. Furthermore, the channels 2330 of the removal key card 2300b engage the pins 2235 on the engaging spring plungers 2220 and force the pins 2235 closer together, causing the engaging spring plungers 2240 to retract and disengage from the mating hinge 2210. When the locking spring plungers 2240 and the engaging spring plungers 2220 disengage from the mating hinge 2210, the mounted hinge base 2205 and the mounted hinge base 2205 can be detached from each other as shown in FIG. 23E. As a result, the display assembly (not shown in FIG. 23C) attached to the mounted hinge base 2205 can be detached.

The key cards 2300a and 2300b (shown in FIG. 23A) can also serve as an additional measure of security for when the display assembly is installed in public places. For example, if used in context of the cabinets with TOLED displays installed in portrait mode as shown in FIGS. 17D and 17E, the TOLED displays could be installed with the versatile hinge mechanism 2200 (shown in FIGS. 22A and 22B), and could serve as a locked door (as shown in FIG. 17D), with the employee needing only key card 2300a to unlock the showpiece cabinet (as shown in FIG. 17E). The method of inserting the unlock (or Hinge Unlock) key card 2300a is shown in FIG. 23B, and the method of inserting the removal (Hinge Removal) key card 2300b is shown in FIG. 23D. The actions of the unlock (or Hinge Unlock) key card 2300a and the removal (Hinge Removal) key card 2300b are shown in FIGS. 23C and 23E respectively.

Figure 24:
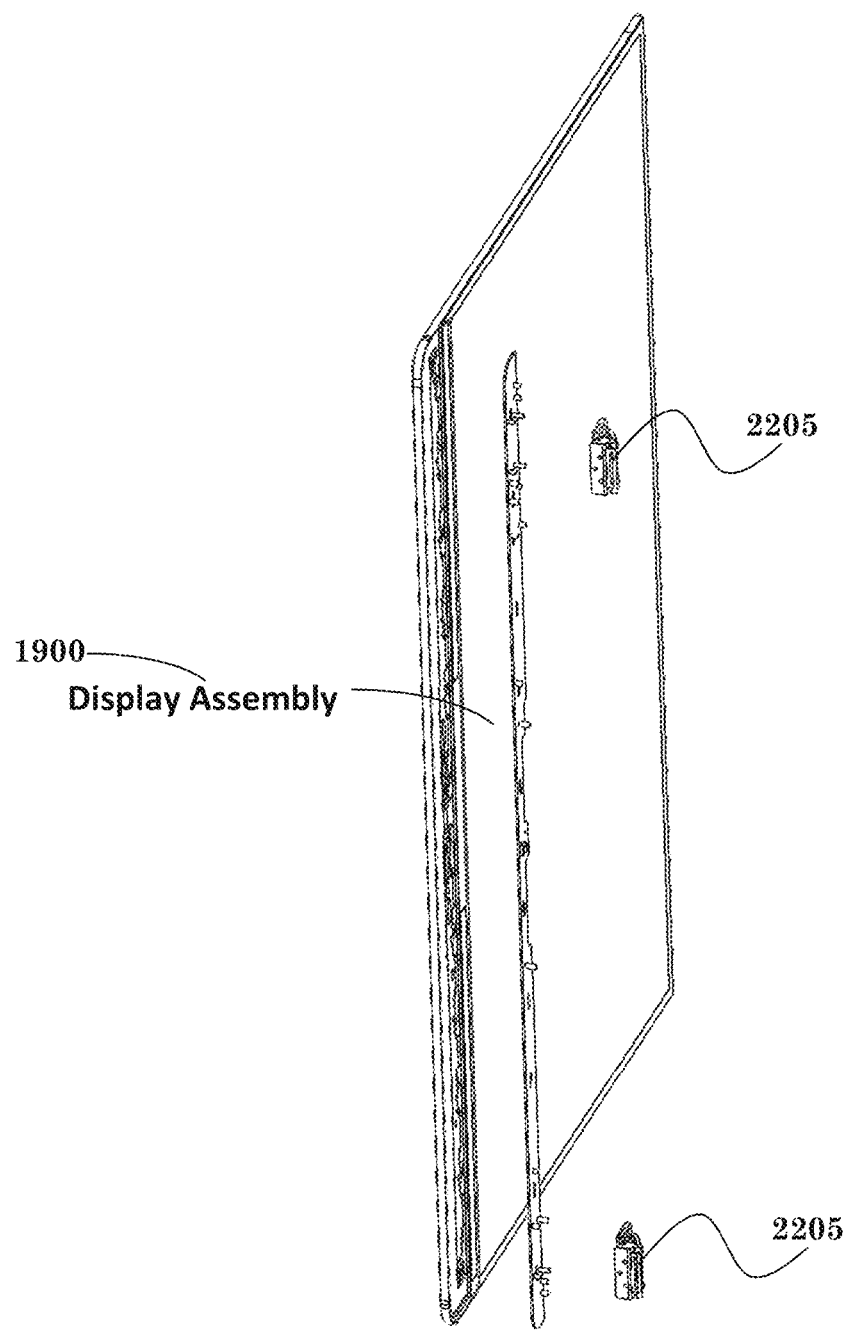
FIG. 24 illustrates a hinge mechanism assembly (shown in FIGS. 22A-22D) installed on a display assembly according to one exemplary embodiment.
Figure 25:
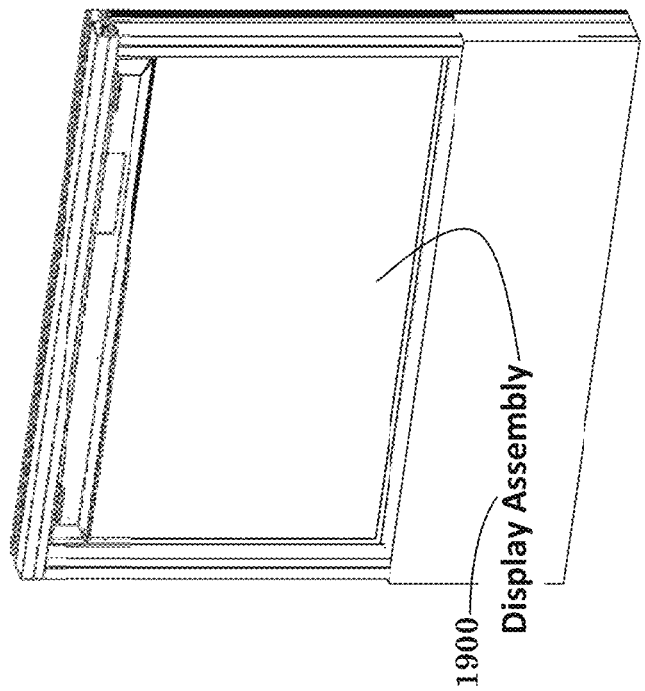
FIG. 25 illustrates a display assembly installed on a support structure in a locked and unlocked position according to one exemplary embodiment.
Figure 25:
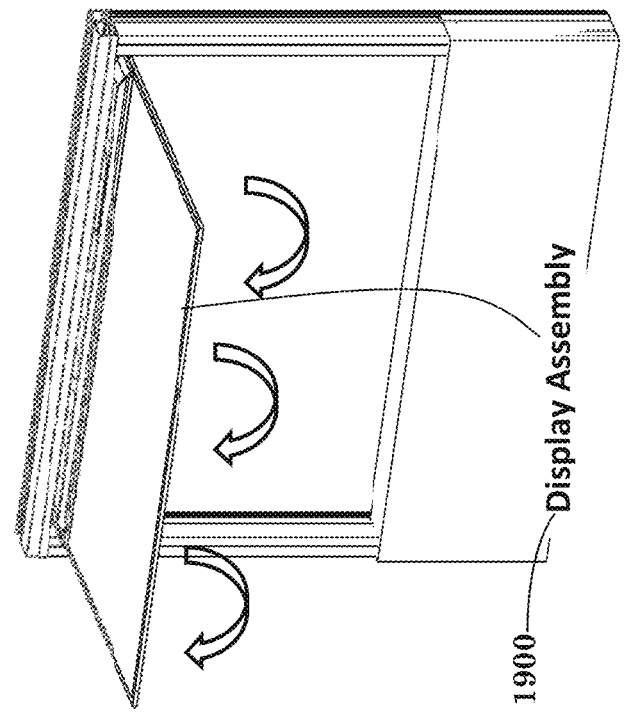

An exemplary embodiment of the mounted hinge base 2205 installed on a display assembly 1900 is shown in FIG. 24. The same display assembly 1900 is shown in FIG. 25 mounted on a structural frame and able to rotate about the hinge mechanism assembly (shown in FIGS. 22A-22D) with the use of unlock (or Hinge Unlock) key card 2300a as shown in FIGS. 23B and 23C. The same mounted hinge base 2205 can be used to snap on desktop legs onto a display assembly 1900, according to one exemplary embodiment as show in FIG. 26.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. While various embodiments of the invention have been described, it will be apparent to those of ordinary skill in the art that many more embodiments and implementations are possible within the scope of this invention. Moreover, various features and functionalities described in this application and Figures may be combined individually and/or plurality of features and functionalities with others. Accordingly, the invention is not to be restricted except in light of the attached claims and their equivalents. the known and customary practice within the art to which the invention pertains.

The invention claimed is:

1. A system for removable or semi-permanent installation of a transparent organic lighting diode (TOLED) display, comprising:
   a TOLED display that includes a TOLED panel with a front side and a back side, a cover glass or a touch sensor coupled to the front side of the TOLED panel, and a transparency control medium coupled to the back side of the TOLED panel to provide transparency control of the TOLED panel, wherein the transparency control medium is an electrochromic (EC) glass, a Suspended Particle Device (SPD) film, or a Polymer Dispersed Liquid Crystal (PDLC) film; and
   a versatile hinge assembly coupled to the TOLED display to enable the TOLED display to be used in a table top or desktop configuration or to be mounted to a support structure.

2. The system of claim 1, wherein the versatile hinge assembly comprises:
   a mating hinge coupled to the support structure; and
   a mounted hinge base coupled to the TOLED display,
   wherein the mounted hinge base includes locking spring plungers attached to a first spring, and the locking spring plungers engage the mating hinge to facilitate locking and unlocking of the TOLED display, and
   wherein the mounted hinge base includes engaging spring plungers attached to a second spring, and the engaging spring plungers engages the mating hinge to couple the mounted hinge base to the mating hinge.

3. The system of claim 2, wherein an unlocking key card is used to unlock the TOLED display to allow the TOLED display to be rotated.

4. The system of claim 3, wherein the unlocking key card causes the locking spring plungers to retract and disengage from the mating hinge thereby unlocking the TOLED display to allow the TOLED display to be rotated.

5. The system of claim 2, wherein a removal key card is used to disengage or remove the TOLED display from the support structure.

6. The system of claim 5, wherein the removal key causes the engaging spring plungers to retract and disengage from the mating hinge thereby allowing the TOLED display to be disengaged or removed from the support structure.

7. The system of claim 1, wherein the TOLED panel is turned off and the transparency control medium is not tinted to allow transparency through the TOLED panel.

8. The system of claim 1, wherein the TOLED panel is turned on and the transparency control medium is tinted to block transparency through the TOLED panel and to allow content displayed on the TOLED to be visible.

9. The system of claim 1, wherein the transparency control medium has a transmittance range of 60% (not tinted) to 2% (fully tinted).

10. The system of claim 1, wherein a low voltage electric current is applied to the transparency control medium to start a tinting process.

11. The system of claim 1, wherein voltage electric current applied to the transparency control medium is regulated to control tinting levels of the EC glass.

12. The system of claim 1, further comprises:
    electronic components to control and power the TOLED panel, wherein the electronic components are housed inside the support structure.

13. The system of claim 1, further comprises:
    a Projective Capacitive Touch (PCAP) panel and a PCAP controller to facilitate touch control.

14. The system of claim 1, wherein the transparency control medium is applicable for flat and curved display geometries.

* * * * *